(12) United States Patent
Yamazaki et al.

(10) Patent No.: US 11,024,763 B2
(45) Date of Patent: Jun. 1, 2021

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Kengo Akimoto, Atsugi (JP); Shigeki Komori, Isehara (JP); Hideki Uochi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/141,187

(22) Filed: Sep. 25, 2018

(65) Prior Publication Data

US 2019/0027640 A1   Jan. 24, 2019

Related U.S. Application Data

(60) Continuation of application No. 13/705,734, filed on Dec. 5, 2012, now Pat. No. 10,181,545, which is a
(Continued)

(30) Foreign Application Priority Data

Sep. 12, 2008   (JP) ................. 2008-234603

(51) Int. Cl.
*H01L 33/00* (2010.01)
*H01L 27/12* (2006.01)
(Continued)

(52) U.S. Cl.
CPC ...... *H01L 33/0041* (2013.01); *H01L 27/1225* (2013.01); *H01L 29/66969* (2013.01);
(Continued)

(58) Field of Classification Search
None
See application file for complete search history.

(56) References Cited

U.S. PATENT DOCUMENTS 5,459,596 A   10/1995   Ueda et al.
5,600,461 A   2/1997   Ueda et al.
(Continued)

FOREIGN PATENT DOCUMENTS

EP   0592063 A   4/1994
EP   1087255 A   3/2001
(Continued)

OTHER PUBLICATIONS

International Search Report (Application No. PCT/JP2009/065018) dated Nov. 17, 2009.
(Continued)

*Primary Examiner* — Nishath Yasmeen
(74) *Attorney, Agent, or Firm* — Robinson Intellectual Property Law Office; Eric J. Robinson

(57) ABSTRACT

An object is to provide a semiconductor device including a thin film transistor with excellent electrical characteristics and high reliability and a method for manufacturing the semiconductor device with high mass productivity. A main point is to form a low-resistance oxide semiconductor layer as a source or drain region after forming a drain or source electrode layer over a gate insulating layer and to form an oxide semiconductor film thereover as a semiconductor layer. It is preferable that an oxygen-excess oxide semiconductor layer be used as a semiconductor layer and an oxygen-deficient oxide semiconductor layer be used as a source region and a drain region.

20 Claims, 27 Drawing Sheets

Related U.S. Application Data division of application No. 12/553,119, filed on Sep. 3, 2009, now Pat. No. 9,257,594.

(51) Int. Cl.
*H01L 29/786* (2006.01)
*H01L 29/66* (2006.01)

(52) U.S. Cl.
CPC .... *H01L 29/7869* (2013.01); *H01L 29/78618* (2013.01); *H01L 2924/0002* (2013.01)

(56) References Cited

U.S. PATENT DOCUMENTS

| | | |
|---|---|---|
| 5,610,414 A | 3/1997 | Yoneda et al. |
| 5,731,856 A | 3/1998 | Kim et al. |
| 5,744,864 A | 4/1998 | Cillessen et al. |
| 5,835,177 A * | 11/1998 | Dohjo ................ H01L 27/1214 349/147 |
| 6,011,309 A | 1/2000 | Ahn |
| 6,016,174 A | 1/2000 | Endo et al. |
| 6,294,274 B1 | 9/2001 | Kawazoe et al. |
| 6,356,331 B1 | 3/2002 | Ono et al. |
| 6,444,484 B1 | 9/2002 | Ahn |
| 6,531,346 B1 | 3/2003 | Kim |
| 6,563,174 B2 | 5/2003 | Kawasaki et al. |
| 6,587,160 B2 | 7/2003 | Lee et al. |
| 6,727,522 B1 | 4/2004 | Kawasaki et al. |
| 6,747,289 B2 | 6/2004 | Yamazaki et al. |
| 6,812,528 B2 | 11/2004 | Uchida |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,139,044 B2 | 11/2006 | Lee et al. |
| 7,211,825 B2 | 5/2007 | Shih et al. |
| 7,256,421 B2 | 8/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,351,623 B2 | 4/2008 | Ahn |
| 7,379,058 B2 | 5/2008 | Toyozawa et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,566,952 B2 | 7/2009 | Floyd et al. |
| 7,576,394 B2 | 8/2009 | Furuta et al. |
| 7,674,650 B2 | 3/2010 | Akimoto et al. |
| 7,710,506 B2 | 5/2010 | Lee et al. |
| 7,732,819 B2 | 6/2010 | Akimoto et al. |
| 7,768,585 B2 | 8/2010 | Nakamura |
| 7,772,021 B2 | 8/2010 | Lee et al. |
| 7,807,483 B2 | 10/2010 | Yamazaki et al. |
| 7,884,360 B2 | 2/2011 | Takechi et al. |
| 7,960,730 B2 | 6/2011 | Lee et al. |
| 7,981,734 B2 | 7/2011 | Furuta et al. |
| 7,986,379 B2 | 7/2011 | Lee et al. |
| 7,995,172 B2 | 8/2011 | Ishii |
| 8,058,116 B2 | 11/2011 | Bae et al. |
| 8,120,031 B2 | 2/2012 | Yamazaki et al. |
| 8,134,156 B2 | 3/2012 | Akimoto |
| 8,158,464 B2 | 4/2012 | Akimoto |
| 8,164,256 B2 | 4/2012 | Sano et al. |
| 8,169,572 B2 | 5/2012 | Yamanaka et al. |
| 8,253,872 B2 | 8/2012 | Ina et al. |
| 8,299,469 B2 | 10/2012 | Chang |
| 8,368,079 B2 | 2/2013 | Akimoto |
| 8,420,442 B2 | 4/2013 | Takechi et al. |
| 8,471,252 B2 | 6/2013 | Yamazaki et al. |
| 8,507,910 B2 | 8/2013 | Ofuji et al. |
| 8,525,165 B2 | 9/2013 | Akimoto |
| 8,541,944 B2 | 9/2013 | Sano et al. |
| 8,558,225 B2 | 10/2013 | Bae et al. |
| 8,618,548 B2 | 12/2013 | Chang |
| 8,889,480 B2 | 11/2014 | Takechi et al. |
| 8,900,917 B2 | 12/2014 | Yamazaki et al. |
| 9,312,288 B2 | 4/2016 | Chang |
| 9,366,930 B2 | 6/2016 | Yamazaki et al. |
| 2001/0046027 A1 | 11/2001 | Tai et al. |
| 2002/0056838 A1 | 5/2002 | Ogawa |
| 2002/0109796 A1 | 8/2002 | Lin et al. |
| 2002/0132454 A1 | 9/2002 | Ohtsu et al. |
| 2002/0135709 A1 | 9/2002 | Sung Chae et al. |
| 2003/0189206 A1 * | 10/2003 | Koyama ............. G09G 3/3283 257/59 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0057151 A1 * | 3/2005 | Kuwahara ............ H05B 33/22 313/506 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0215067 A1 | 9/2006 | Ueda et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0037352 A1 | 2/2007 | Suzawa et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 * | 3/2007 | Akimoto ........... H01L 21/02266 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0017886 A1 * | 1/2008 | Chang ................ G02F 1/136213 257/203 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0068550 A1 | 3/2008 | Chang et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0131822 A1 | 6/2008 | Liao et al. |
| 2008/0166834 A1 | 7/2008 | Kim et al. |
| 2008/0182358 A1 | 7/2008 | Cowdery-Corvan et al. |
| 2008/0204618 A1 | 8/2008 | Jung et al. |
| 2008/0218091 A1 | 9/2008 | Jo et al. |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2015/0056747 A1 | 2/2015 | Takechi et al. |
| 2015/0160490 A1 | 6/2015 | Yamazaki et al. |

FOREIGN PATENT DOCUMENTS

| | | |
|---|---|---|
| EP | 1737044 A | 12/2006 |
| EP | 2226847 A | 9/2010 |
| EP | 2372443 A | 10/2011 |
| EP | 3249694 A | 11/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-203994 A | 8/1993 |
| JP | 05-251705 A | 9/1993 |
| JP | 06-075246 A | 3/1994 |
| JP | 08-264794 A | 10/1996 |
| JP | 10-186410 A | 7/1998 |
| JP | 11-505377 | 5/1999 |
| JP | 2000-044236 A | 2/2000 |
| JP | 2000-150900 A | 5/2000 |
| JP | 2000-299439 A | 10/2000 |
| JP | 2001-092378 A | 4/2001 |
| JP | 2001-352069 A | 12/2001 |
| JP | 2002-014337 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-332342 A | 11/2003 |
| JP | 2004-079509 A | 3/2004 |
| JP | 2004-103957 A | 4/2004 |
| JP | 2004-226787 A | 8/2004 |
| JP | 2004-273614 A | 9/2004 |
| JP | 2004-273732 A | 9/2004 |
| JP | 2004-288786 A | 10/2004 |
| JP | 2005-215343 A | 8/2005 |
| JP | 2006-058676 A | 3/2006 |
| JP | 2006-165527 A | 6/2006 |
| JP | 2006-165531 A | 6/2006 |
| JP | 2006-191027 A | 7/2006 |
| JP | 2006-267605 A | 10/2006 |
| JP | 2007-096055 A | 4/2007 |
| JP | 2007-123861 A | 5/2007 |
| JP | 2007-150158 A | 6/2007 |
| JP | 2007-165861 A | 6/2007 |
| JP | 2007-316104 A | 12/2007 |
| JP | 2008-042088 A | 2/2008 |
| JP | 2008-141119 A | 6/2008 |
| JP | 2008-170757 A | 7/2008 |
| JP | 2008-175930 A | 7/2008 |
| JP | 2008-535205 | 8/2008 |
| JP | 2008-203856 A | 9/2008 |
| JP | 2008-211184 A | 9/2008 |
| JP | 2010-062547 A | 3/2010 |
| JP | 2010-278412 A | 12/2010 |
| KR | 1998-0072529 A | 11/1998 |
| KR | 1999-0036638 A | 5/1999 |
| KR | 2003-0011183 A | 2/2003 |
| KR | 2008-0007813 A | 1/2008 |
| KR | 2008-0048936 A | 6/2008 |
| KR | 2008-0052107 A | 6/2008 |
| TW | I228199 | 2/2005 |
| TW | 200822226 | 5/2008 |
| TW | 200823817 | 6/2008 |
| WO | WO-2004/114391 | 12/2004 |
| WO | WO-2007/058329 | 5/2007 |
| WO | WO-2007/089048 | 8/2007 |
| WO | WO-2007/139198 | 12/2007 |
| WO | WO-2008/069286 | 6/2008 |
| WO | WO-2008/093583 | 8/2008 |

OTHER PUBLICATIONS

Written Opinion (Application No. PCT/JP2009/065018) dated Nov. 17, 2009.

Fortunato.E et al., "Wide-Bandgap High-Mobility ZNO Thin-Film Transistors Produced at Room Temperature", Appl. Phys. Lett. (Applied Physics Letters) ,Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing M003 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Phyics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Ppaers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZNO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Sympsium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies In ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Korean Office Action (Application No. 2011-7008275) dated Aug. 25, 2015.

Taiwanese Office Action (Application No. 104102309) dated Nov. 3, 2015.

Korean Office Action (Application No. 2016-7012664) dated Jun. 21, 2016.

Korean Office Action (Application No. 2016-7012664) dated Dec. 29, 2016.

Korean Office Action (Application No. 2017-7005751) dated Mar. 22, 2017.

Taiwanese Office Action (Application No. 107130177) dated Jan. 21, 2020.

\* cited by examiner

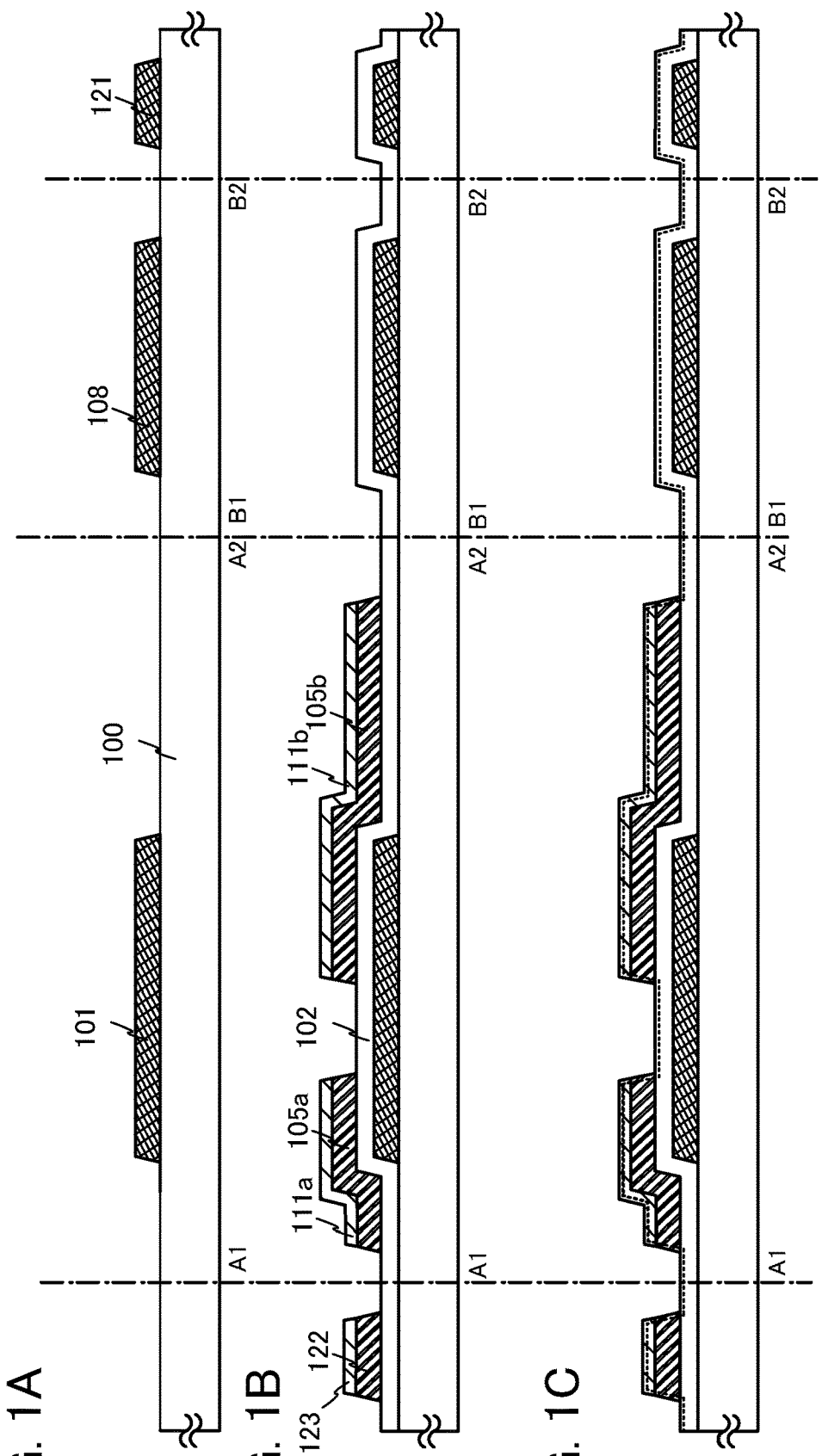

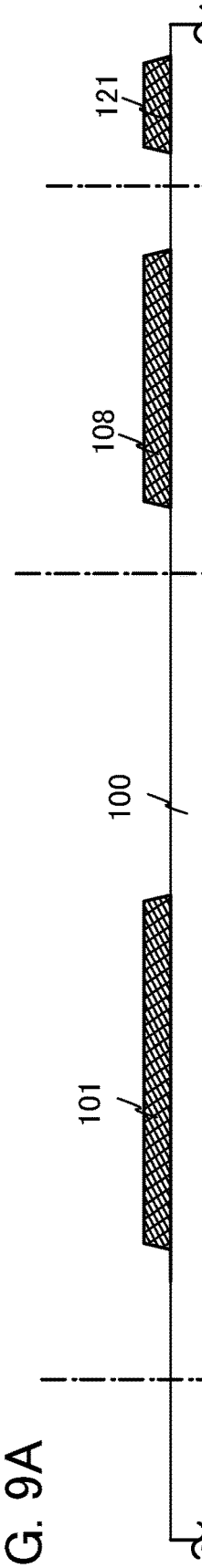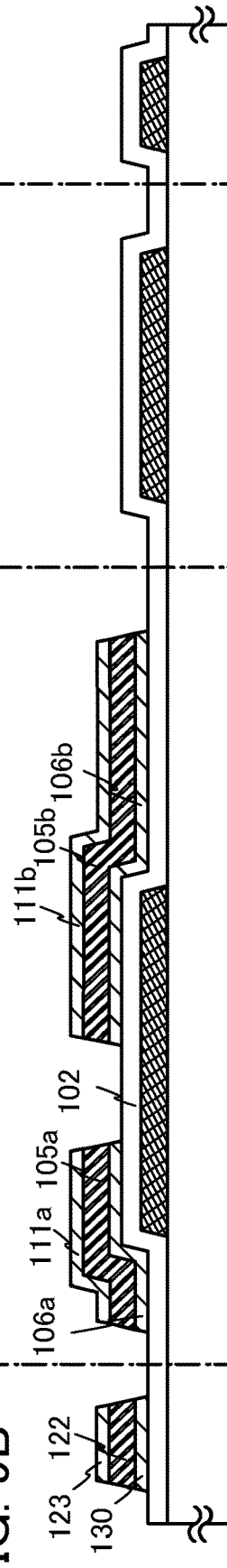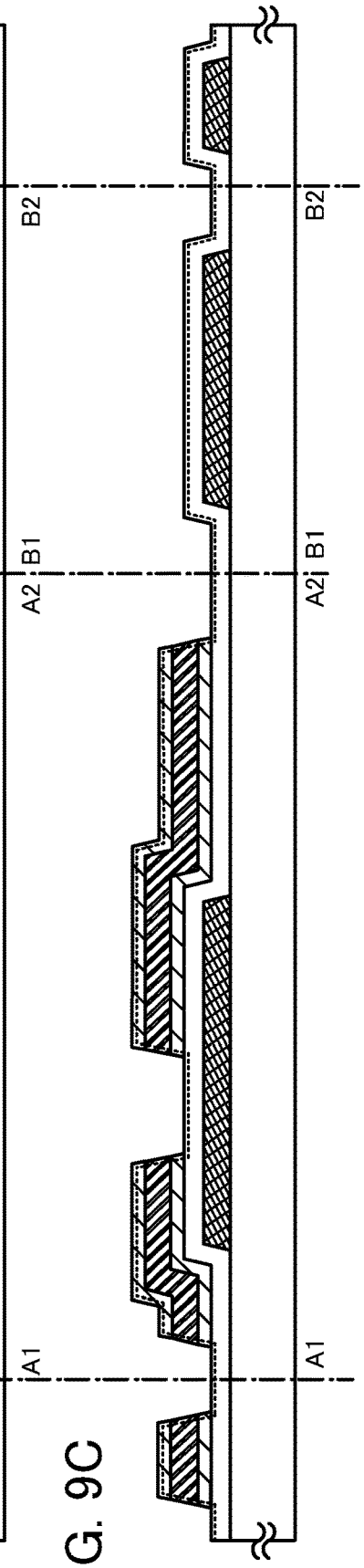

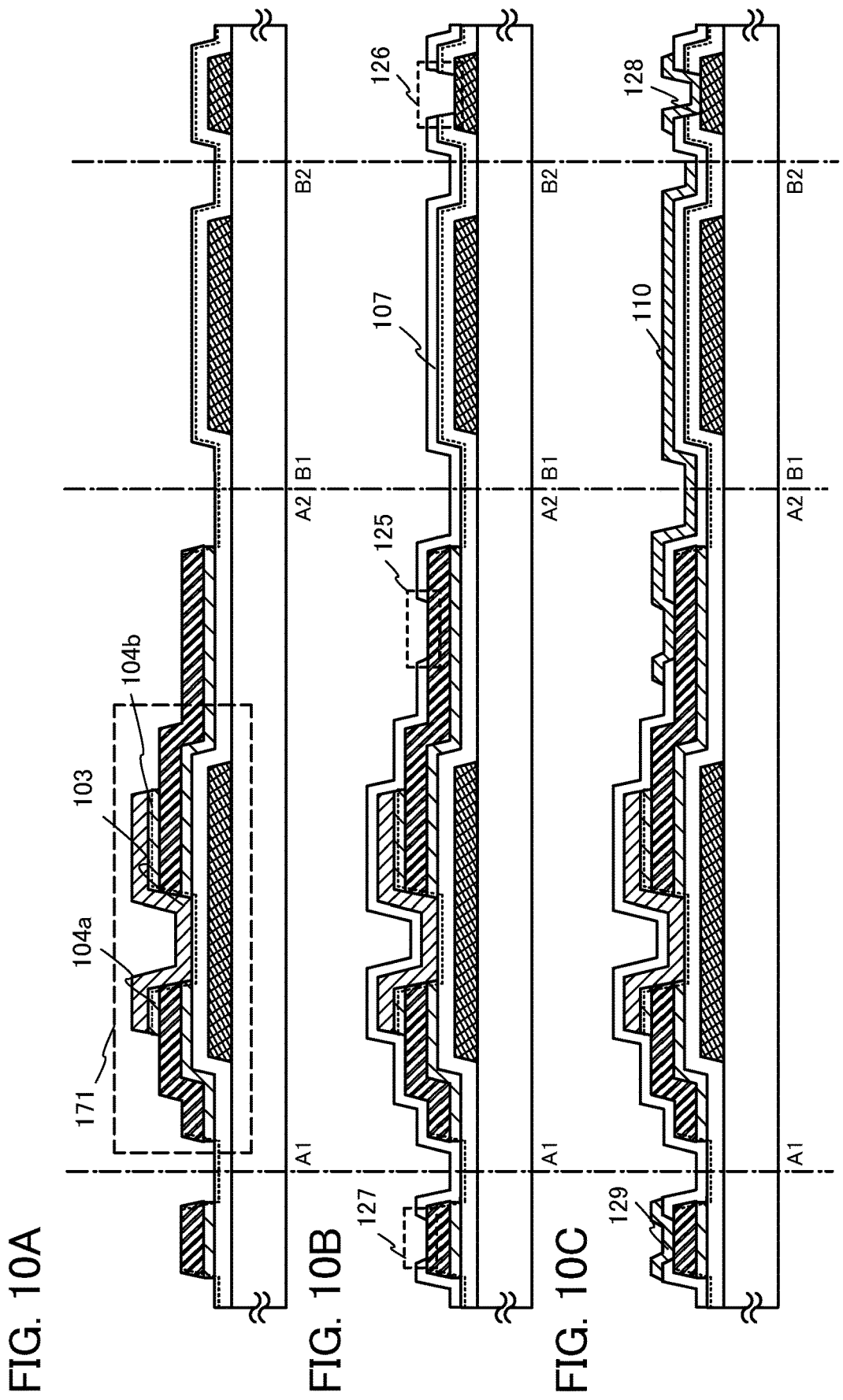

US 11,024,763 B2

SEMICONDUCTOR DEVICE AND METHOD FOR MANUFACTURING THE SAME

TECHNICAL FIELD

The present invention relates to a semiconductor device which has a circuit including a thin film transistor (hereinafter referred to as a TFT) in which a channel formation region is formed using an oxide semiconductor film and a manufacturing method thereof. For example, the present invention relates to an electronic device in which an electro-optical device typified by a liquid crystal display panel or a light-emitting display device including an organic light-emitting element is mounted as its component.

Note that the semiconductor device in this specification refers to all the devices which can operate by using semiconductor characteristics, and an electro-optical device, a semiconductor circuit, and an electronic device are all included in the semiconductor devices.

BACKGROUND ART

In recent years, active matrix display devices (such as liquid crystal display devices, light-emitting display devices, or electrophoretic display devices) in which a switching element including a TFT is provided in each of display pixels arranged in a matrix have been actively developed. In the active matrix display devices, a switching element is provided in each of pixels (or each of dots), and thus, there is such an advantage that the active matrix display devices can be driven at lower voltage than passive matrix display devices in the case where the pixel density is increased.

In addition, a technique has attracted attention, where a thin film transistor (TFT) in which a channel formation region is formed using an oxide semiconductor film, or the like is manufactured and such a TFT or the like is applied to electronic devices or optical devices. For example, a TFT in which zinc oxide (ZnO) is used as an oxide semiconductor film or a TFT in which $InGaO_3(ZnO)_m$ is used as an oxide semiconductor film can be given. A technique in which a TFT including such an oxide semiconductor film is formed over a light-transmitting substrate and used as a switching element or the like of an image display device, is disclosed in Reference 1 and Reference 2.

REFERENCE

Patent Document

Reference 1: Japanese Published Patent Application No. 2007-123861
Reference 2: Japanese Published Patent Application No. 2007-096055

DISCLOSURE OF INVENTION

For a thin film transistor in which a channel formation region is formed using an oxide semiconductor film, high speed operation, a relatively easy manufacturing process, and sufficient reliability are required.

In formation of a thin film transistor, a low-resistance metal material is used for a source electrode and a drain electrode. In particular, when a display device with a large-area display is manufactured, a problem of signal delay due to resistance of a wiring significantly arises. Accordingly, it is preferable that a metal material with a low electrical resistance value be used as a material of a wiring and an electrode. In a thin film transistor having a structure in which an oxide semiconductor film and source and drain electrodes formed using a metal material with a low electrical resistance value are in direct contact with each other, there is a concern that contact resistance increases. One of conceivable reasons for increase of contact resistance is that Schottky junction is formed at a contact surface between the source and drain electrodes and the oxide semiconductor film.

In addition, capacitance is formed in a portion where the source and drain electrodes and the oxide semiconductor film have a direct contact with each other, and there are risks that frequency characteristics (called "f characteristics") decrease and high speed operation of the thin film transistor is hindered.

An object of an embodiment of the present invention is to provide a thin film transistor and a manufacturing method thereof, in which an oxide semiconductor film is used and the contact resistance of a source or drain electrode is reduced.

Another object is to improve operation characteristics and reliability of the thin film transistor in which an oxide semiconductor film is used.

Further, another object is to reduce variation in electrical characteristics of the thin film transistor in which an oxide semiconductor film is used. In particular, in a liquid crystal display device where variation between elements is large, there is a risk that display unevenness due to variation in the TFT characteristics is caused.

Further, in a display device including a light-emitting element, in the case where there is large variation in on-current ($I_{on}$) of TFTs (TFTs provided in a driver circuit or TFTs supplying current to light-emitting elements arranged in pixels) arranged so as to make constant current flow to a pixel electrode, there is a risk that variation in luminance is generated on a display screen.

An embodiment of the present invention aims to achieve at least one of the above-described objects.

A main point of an embodiment of the present invention is to form a low-resistance oxide semiconductor layer as a source or drain region after forming a source or drain electrode layer over a gate insulating layer and to form an oxide semiconductor film thereover as a semiconductor layer. It is preferable that an oxygen-excess oxide semiconductor layer is used as a semiconductor layer and an oxygen-deficient oxide semiconductor layer be used as a source region and a drain region. This oxygen-deficient oxide semiconductor layer serving as a source region and a drain region may include crystal grains with a diameter of about 1 nm to 10 nm, typically, about 2 nm to 4 nm.

In addition, a source region and a drain region formed from a low-resistance oxide semiconductor layer may also be provided between a gate insulating layer and source and drain electrode layers. In this case, the source and drain electrode layers are sandwiched between a first source or drain region and a second source or drain region.

The oxide semiconductor layer used as a semiconductor layer (a first oxide semiconductor layer) has a higher oxygen concentration than the oxide semiconductor layer used as source and drain regions (a second oxide semiconductor layer). It can be said that the first oxide semiconductor layer is an oxygen-excess oxide semiconductor layer and the second oxide semiconductor layer is an oxygen-deficient oxide semiconductor layer.

The second oxide semiconductor layer shows n-type conductivity and has higher electrical conductance than the first oxide semiconductor layer. Thus, the source and drain regions have low resistance than the semiconductor layer.

The first oxide semiconductor layer may have an amorphous structure, and the second oxide semiconductor layer may include crystal grains in an amorphous structure.

Note that the ordinal numbers such as "first" and "second" in this specification are used for convenience and do not denote the order of steps and the stacking order of layers. In addition, the ordinal numbers in this specification do not denote any particular names to define the invention.

Ohmic contact is needed between the source electrode layer and the oxide semiconductor layer, and moreover, its contact resistance is preferably reduced as much as possible. Similarly, ohmic contact is needed between the drain electrode layer and the oxide semiconductor layer, and its contact resistance is preferably reduced as much as possible.

Thus, source and drain regions having higher carrier concentration than the oxide semiconductor layer are intentionally provided between the source and drain electrode layers and the gate insulating layer, so that ohmic contact is made. A low-resistance oxide semiconductor layer which functions as the source and drain regions has n-type conductivity and is also referred to as an $n^+$ region. In the case where the source and drain regions are called $n^+$ regions, an oxide semiconductor layer which functions as a channel formation region is also called an i-type region.

An embodiment of a semiconductor device of the present invention includes a thin film transistor which includes a gate electrode layer, a gate insulating layer over the gate electrode layer, a source electrode layer and a drain electrode layer over the gate insulating layer, a source region and a drain region over the source electrode layer and the drain electrode layer, and an oxide semiconductor layer over the gate insulating layer, the source electrode layer, the drain electrode layer, the source region, and the drain region. The oxide semiconductor layer overlaps the gate electrode layer with the gate insulating layer interposed therebetween and has a higher oxygen concentration than the source region and the drain region.

Another embodiment of a semiconductor device of the present invention includes a thin film transistor which includes a gate electrode layer, a gate insulating layer over the gate electrode layer, a first source region and a first drain region over the gate insulating layer, a source electrode layer and a drain electrode layer over the first source region and the first drain region, a second source region and a second drain region over the source electrode layer and the drain electrode layer, and an oxide semiconductor layer over the gate insulating layer, the first source region, the first drain region, the source electrode layer, the drain electrode layer, the second source region, and the second drain region. The oxide semiconductor layer overlaps the gate electrode layer with the gate insulating layer interposed therebetween and has a higher oxygen concentration than the first source region, the first drain region, the second source region, and the second drain region.

The present invention achieves at least one of the above-described objects.

In the above structure, the source region and the drain region (the first source region, the first drain region, the second source region, and the second drain region) are oxide semiconductor layers containing indium, gallium, and zinc and are films which have a lower resistance than the semiconductor layer and which may include crystal grains with a size of 1 nm to 10 nm. In addition, an end face of the source region (the first source region, the second source region) and an end face of the drain region (the first drain region, the second drain region) facing the end face of the source region are in contact with the semiconductor layer.

Note that for the semiconductor layer or the source and drain regions (the first source region, the first drain region, the second source region, and the second drain region), an oxide semiconductor film containing In, Ga, and Zn can be used. Furthermore, any one of In, Ga, and Zn may be replaced with tungsten, molybdenum, titanium, nickel, or aluminum.

In this specification, a semiconductor layer formed using an oxide semiconductor film containing In, Ga, and Zn is also referred to as an "IGZO semiconductor layer." An IGZO semiconductor layer is a non-single-crystal semiconductor layer and includes at least an amorphous component.

A method for manufacturing a semiconductor device is also an embodiment of the present invention, and plasma treatment is performed after a source electrode layer, a drain electrode layer, a source region, and a drain region are formed. In addition, after the plasma treatment, a semiconductor layer is formed by a sputtering method without exposure to air. If a film formation substrate is exposed to air before the semiconductor layer is formed, moisture or the like is attached and the interface state is adversely affected, which may cause defects such as variation in threshold voltages, deterioration in electrical characteristics, and a normally-on TFT. For the plasma treatment, an oxygen gas or an argon gas is used. Instead of an argon gas, another rare gas may be used.

In an embodiment of a method for manufacturing a semiconductor device of the present invention, a gate electrode layer is formed over a substrate. A gate insulating layer is formed over the gate electrode layer. A source electrode layer and a drain electrode layer are formed over the gate insulating layer. A source region and a drain region are formed over the source electrode layer and the drain electrode layer. The gate insulating layer, the source electrode layer, the drain electrode layer, the source region, and the drain region are subjected to plasma treatment. An oxide semiconductor layer is formed without exposure to air over the gate insulating layer, the source electrode layer, the drain electrode layer, the source region, and the drain region after the plasma treatment to overlap the gate electrode layer. The oxide semiconductor layer has a higher oxygen concentration than the source region and the drain region.

In another embodiment of a method for manufacturing a semiconductor device of the present invention, a gate electrode layer is formed over a substrate. A gate insulating layer is formed over the gate electrode layer. A first source region and a first drain region are formed over the gate insulating layer. A source electrode layer and a drain electrode layer are formed over the first source region and the first drain region. A second source region and a second drain region are formed over the source electrode layer and the drain electrode layer. The gate insulating layer, the first source region, the first drain region, the source electrode layer, the drain electrode layer, the second source region, and the second drain region are subjected to plasma treatment. An oxide semiconductor layer is formed without exposure to air over the gate insulating layer, the first source region, the first drain region, the source electrode layer, the drain electrode layer, the second source region, and the second drain region after the plasma treatment to overlap the gate electrode layer. The oxide semiconductor layer has a higher oxygen concentration than the first source region, the first drain region, the second source region, and the second drain region.

By plasma treatment, exposed surfaces of the gate insulating layer, the source electrode layer, the drain electrode layer, the source region, and the drain region can be cleaned. Before the semiconductor layer (IGZO semiconductor layer) is formed, the source electrode layer, the drain electrode layer, the source region, and the drain region are processed by etching using a photolithography technique; thus, it is effective to perform plasma treatment which causes reaction with dust remaining on the surfaces, such as an organic substance, and removal of the dust.

In particular, in order to form the semiconductor layer (IGZO semiconductor layer) by a sputtering method without exposure to air after plasma treatment, it is preferable to perform a kind of plasma treatment called reverse sputtering which allows both plasma treatment and formation of the semiconductor layer (IGZO semiconductor layer) to be performed in the same chamber. The reverse sputtering is a method in which voltage is applied to a substrate side, not to a target side, in an oxygen atmosphere or an oxygen and argon atmosphere and plasma is generated so that a substrate surface is modified.

In the case of performing plasma treatment using an oxygen gas in a chamber, a surface of the gate insulating layer is modified into an oxygen-excess region by being irradiated with oxygen radicals, whereby the oxygen concentration at the interface with the semiconductor layer (IGZO semiconductor layer) to be formed later is increased. When the semiconductor layer is stacked after oxygen radical treatment of the gate insulating layer and then heat treatment is performed, the oxygen concentration in the semiconductor layer (IGZO semiconductor layer) on the gate insulating layer side can also be increased. Accordingly, there is a peak of oxygen concentration at the interface between the gate insulating layer and the semiconductor layer (IGZO semiconductor layer), the oxygen concentration in the gate insulating layer has a gradient, and the oxygen concentration increases toward the interface between the gate insulating layer and the semiconductor layer (IGZO semiconductor layer). The gate insulating layer having an oxygen-excess region and the oxygen-excess oxide semiconductor layer (IGZO semiconductor layer) are compatible with each other and can provide a favorable interface.

Oxygen radicals may be supplied from a plasma generating apparatus with use of a gas including oxygen or from an ozone generating apparatus. By irradiating a thin film with oxygen radicals or oxygen supplied, the film surface can be modified.

In addition, the present invention is not limited to oxygen radical treatment, and argon and oxygen radical treatment may be performed. The term "argon and oxygen radical treatment" means modifying a thin film surface by introducing an argon gas and an oxygen gas and generating plasma.

An Ar atom (Ar) in a reactive space in which an electric field is applied and discharge plasma is generated is excited or ionized by an electron (e) in discharge plasma to an argon radical (Ar*), an argon ion (Ar$^+$), or an electron (e). An argon radical (Ar*) is in a metastable state with high energy, and tends to return to a stable state by reacting with an atom of the same kind or a different kind in its vicinity and exciting or ionizing the atom; thus, reaction occurs like an avalanche phenomenon. In the presence of oxygen in its vicinity at that time, an oxygen atom (O) is excited or ionized to an oxygen radical (O*), an oxygen ion (O$^+$), or oxygen (O). The oxygen radical (O*) reacts with a material at a surface of a thin film that is an object to be treated, whereby surface modification is performed, and reacts with an organic substance at the surface, whereby the organic substance is removed; thus, plasma treatment is performed.

Note that a feature of a radical of an argon gas is to maintain a metastable state for a longer period compared to a radical of a reactive gas (an oxygen gas); accordingly, an argon gas is generally used to generate plasma.

In the case of using an oxygen gas, surfaces of the source electrode layer and the drain electrode layer are oxidized under certain conditions of plasma treatment. In the present invention, plasma treatment is performed after the source region and the drain region are formed over the source electrode layer and the drain electrode layer; thus, only exposed end portions of the source electrode layer and the drain electrode layer are oxidized. Accordingly, only regions of the source electrode layer and the drain electrode layer in contact with the semiconductor layer are oxidized, and the other regions are not oxidized and the resistance thereof can thus be kept low. In addition, the contact area between the source and drain regions and the semiconductor layer is large, and the source region or the drain region can be electrically connected to the semiconductor layer.

In order to reduce the number of photomasks to be used, after processing the source region and the drain region by etching, the source electrode layer and the drain electrode layer may be formed in a self-aligned manner using the source region and the drain region as a mask. In that case, an end face of the source region (or the drain region) is substantially aligned with an end face of the source electrode layer (or the drain electrode layer); thus, the distance between the source region and the drain region is substantially equal to the distance between the source electrode layer and the drain electrode layer.

The IGZO semiconductor layer, the source electrode layer, the drain electrode layer, the source region, and the drain region may be formed by a sputtering method.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with use of microwaves is used without using glow discharge.

In addition, as a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

With use of a variety of these sputtering methods, the semiconductor layer, the source region, the drain region, the source electrode layer, and the drain electrode layer are formed.

In the case of using an IGZO semiconductor layer as the semiconductor layer, the source region and the drain region are also oxide layers containing indium, gallium, and zinc and are formed under film formation conditions different from those for the IGZO semiconductor layer. The film formation conditions for the source region and the drain region include conditions where the regions immediately after the film formation include crystal grains with a size of 1 nm to 10 nm. For example, under film formation conditions where a target of $In_2O_3:Ga_2O_3:ZnO=1:1:1$ is used, a DC sputtering method is employed, and an argon gas and oxygen are introduced into a chamber in an argon gas-to-oxygen flow ratio of 2:1 or only an argon gas is introduced, a film including crystal grains with a size of 1 nm to 10 nm is obtained immediately after film formation in some cases. Note that the target of $In_2O_3:Ga_2O_3:ZnO=1:1:1$ is intentionally designed to have that ratio in order to obtain an amorphous oxide semiconductor film, and the composition ratio in the target may be changed to obtain a film having higher crystallinity for the source region and the drain region. In order to realize a simpler process or lower cost, it is preferable that a film used for the IGZO semiconductor layer and a film used for the source region and the drain region be separately formed using the same target simply by changing gases to be introduced.

When an oxygen-deficient oxide semiconductor layer is positively provided as a source region or a drain region, a junction between a source or drain electrode layer that is a metal layer and an IGZO film is favorable and has higher operation stability also in terms of heat than Schottky junction. In addition, it is important to positively provide a source region or a drain region in order to supply carriers to a channel (on the source side), stably absorb carriers from a channel (on the drain side), or prevent resistance from being formed at an interface with a source electrode layer (or a drain electrode layer). A reduction in resistance is also important to ensure favorable mobility even with high drain voltage.

In addition, a titanium film is preferably used for the source electrode layer and the drain electrode layer. For example, a stacked layer of a titanium film, an aluminum film, and a titanium film has low resistance, and hillock is hardly generated in the aluminum film.

In addition, in a sputtering method, strong energy is imparted to a target by Ar ions; thus, it can be considered that strong strain energy exists in an IGZO semiconductor layer formed. In order to release the strain energy, it is preferable to perform heat treatment at 200° C. to 600° C., typically, 300° C. to 500° C. Through this heat treatment, rearrangement at the atomic level occurs. Because strain energy which inhibits carrier movement is released by the heat treatment, film formation and heat treatment (including optical annealing) are important.

According to an embodiment of the present invention, a thin film transistor with small photoelectric current, small parasitic capacitance, and high on-off ratio can be obtained, so that a thin film transistor having excellent dynamic characteristics can be manufactured. Therefore, a semiconductor device which includes thin film transistors having excellent electrical characteristics and high reliability can be provided.

BRIEF DESCRIPTION OF DRAWINGS

FIGS. 1A to 1C illustrate a method for manufacturing a semiconductor device.

FIGS. 9A to 9C illustrate a method for manufacturing a semiconductor device.

FIGS. 10A to 10C illustrate a method for manufacturing a semiconductor device.

BEST MODE FOR CARRYING OUT THE INVENTION

Figures 2A, 2B, 2C:
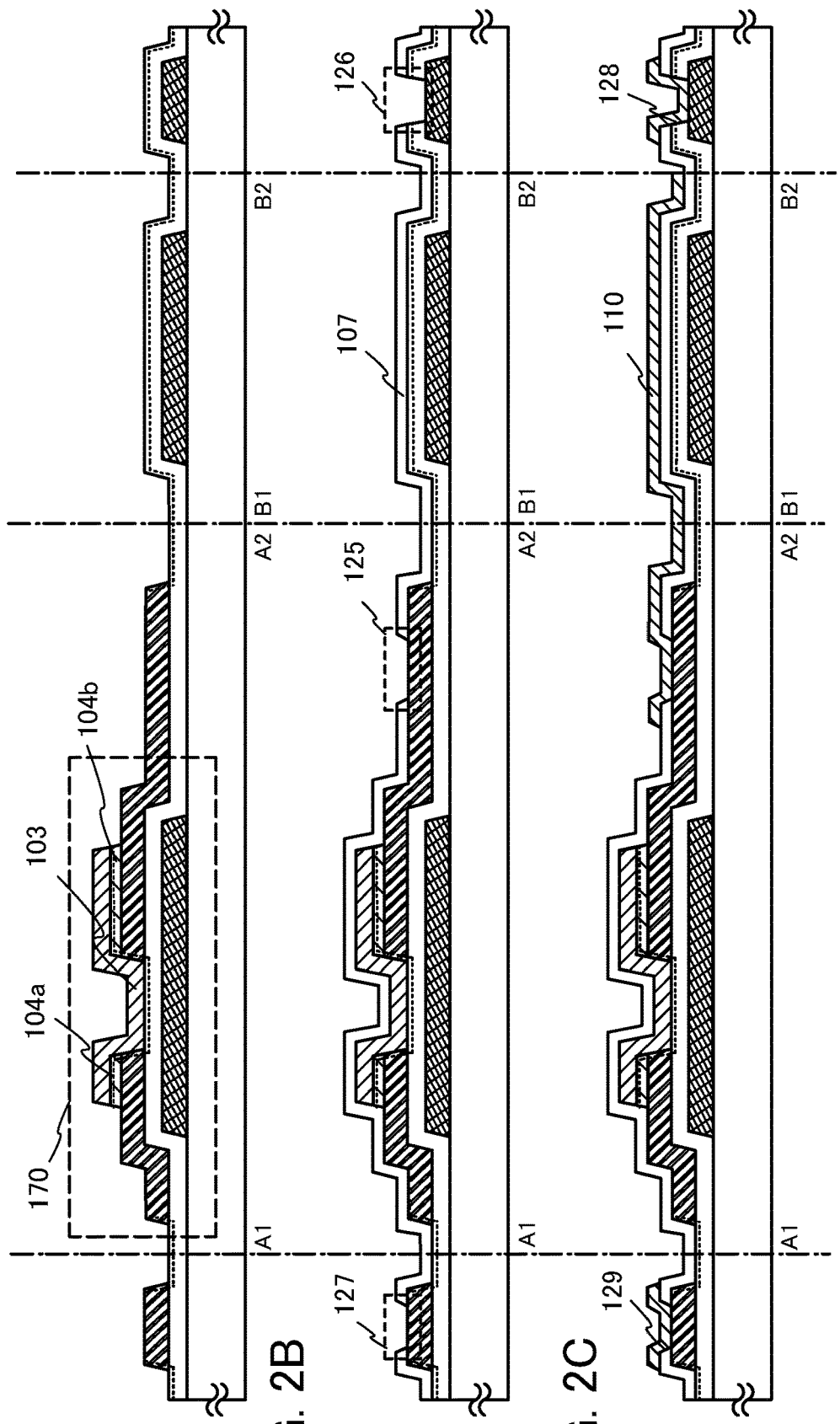
FIGS. 2A to 2C illustrate a method for manufacturing a semiconductor device.
Figure 3:
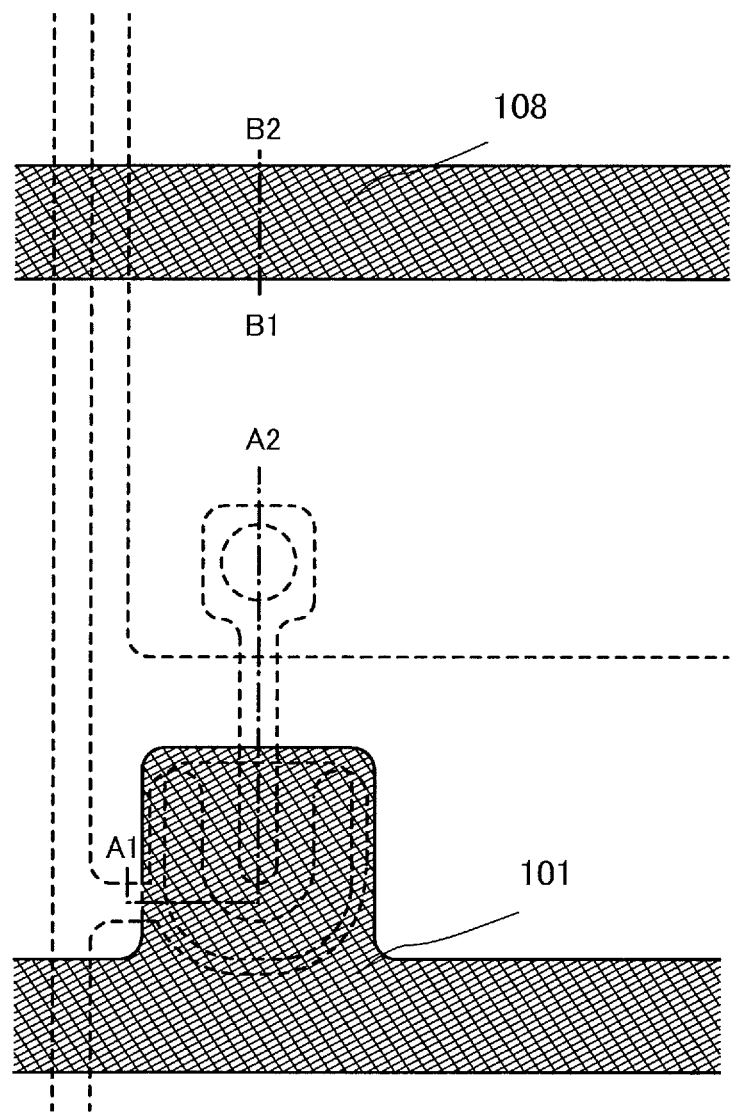
FIG. 3 illustrates a method for manufacturing a semiconductor device.
Figure 4:
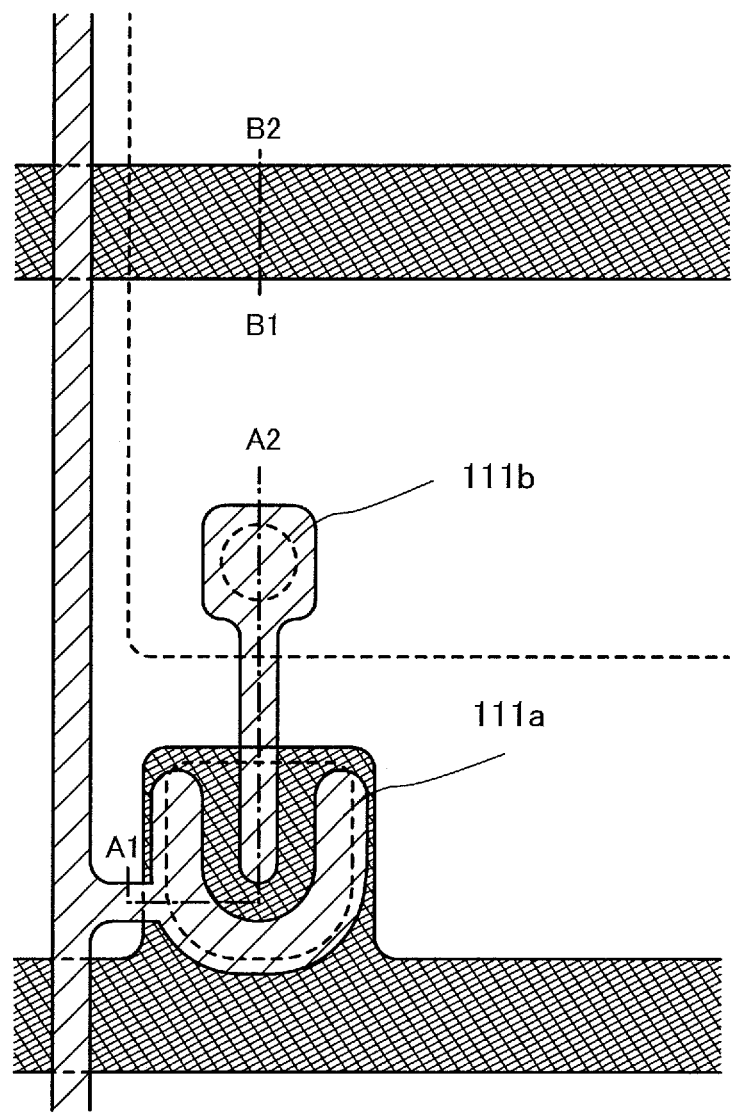
FIG. 4 illustrates a method for manufacturing a semiconductor device.
Figure 5:
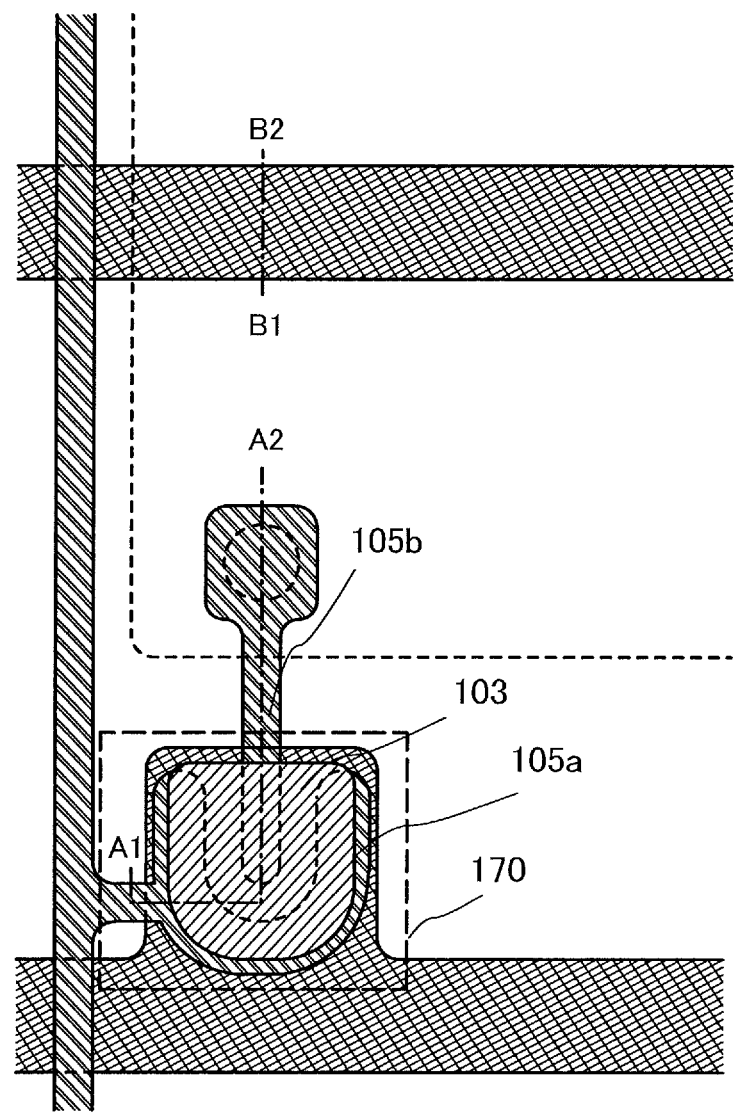
FIG. 5 illustrates a method for manufacturing a semiconductor device.

Embodiments of the present invention will be described in detail with reference to the accompanying drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiments below. Identical portions or portions having similar functions are marked by same reference numerals throughout the drawings so as to omit repeated explanation.

Embodiment 1

In this embodiment, a thin film transistor and a manufacturing process thereof are described with reference to FIGS. 1A to 1C, FIGS. 2A to 2C, FIGS. 3 to 6, and FIGS. 7A to 7D.

In FIG. 1A, as a substrate 100 having a light-transmitting property, a glass substrate of barium borosilicate glass, aluminoborosilicate glass, or the like typified by #7059 glass, #1737 glass, or the like manufactured by Corning, Inc. can be used.

Next, a conductive layer is formed over the entire area of the substrate 100, a first photolithography step is performed to form a resist mask, and an unnecessary portion is removed by etching to form wirings and an electrode (a gate wiring including a gate electrode 101, a capacitor wiring 108, and a first terminal 121). At that time, etching is performed such that at least an edge portion of the gate electrode 101 is formed in a tapered shape. A cross-sectional view at this stage is illustrated in FIG. 1A. Note that a top view at this stage corresponds to FIG. 3.

The gate wiring including the gate electrode 101, the capacitor wiring 108, and the first terminal 121 in a terminal portion are desirably formed using a low-resistance conductive material such as aluminum (Al) or copper (Cu); however, since aluminum alone has disadvantages such as low heat resistance and tendency toward corrosion, it is used in combination with a heat-resistant conductive material to form the gate wiring including the gate electrode 101, the capacitor wiring 108, and the first terminal 121. As the heat-resistant conductive material, an element selected from titanium (Ti), tantalum (Ta), tungsten (W), molybdenum (Mo), chromium (Cr), and neodymium (Nd), an alloy containing any of the elements as its component, an alloy containing any of the elements in combination, or a nitride containing any of the elements as its component is used.

Next, a gate insulating layer 102 is formed over the entire area over the gate electrode 101. The gate insulating layer 102 is formed by a sputtering method or the like to a thickness of 50 nm to 250 nm.

For example, the gate insulating layer 102 is formed using a silicon oxide film with a thickness of 100 nm by a sputtering method. Needless to say, the gate insulating layer 102 is not limited to such a silicon oxide film. The gate insulating layer 102 may be formed to have a single-layer structure or a stacked structure using another insulating film such as a silicon oxynitride film, a silicon nitride film, an aluminum oxide film, or a tantalum oxide film.

Next, a conductive film made from a metal material is formed over the gate insulating layer 102 by a sputtering method or a vacuum evaporation method. As examples of a material of the conductive film, an element selected from Al, Cr, Ta, Ti, Mo, and W, an alloy containing any of the elements as its component, an alloy containing any of the elements in combination, and the like can be given. In this embodiment, the conductive film has a three-layer structure in which a Ti film is formed, an aluminum (Al) film is stacked over the Ti film, and a Ti film is further formed thereover. Alternatively, the conductive film may have a two-layer structure and a titanium film may be stacked over an aluminum film. Still alternatively, the conductive film may have a single-layer structure of an aluminum film containing silicon or a single-layer structure of a titanium film.

Next, a first oxide semiconductor film (in this embodiment, a first IGZO film) is formed over the conductive film by a sputtering method. In this embodiment, sputtering is performed using a target of $In_2O_3:Ga_2O_3:ZnO=1:1:1$ under film formation conditions where the pressure is 0.4 Pa, the power is 500 W, the formation temperature is room temperature, and an argon gas is introduced at a flow rate of 40 sccm. Despite the intentional use of the target of $In_2O_3:Ga_2O_3:ZnO=1:1:1$, an IGZO film including crystal grains with a size of 1 nm to 10 nm immediately after the film formation may be formed. Note that it can be said that the presence or absence of crystal grains or the density of crystal grains can be adjusted and the diameter size can be adjusted within the range of 1 nm to 10 nm by appropriate adjustment of the composition ratio in the target, the film formation pressure (0.1 Pa to 2.0 Pa), the power (250 W to 3000 W: 8 inches ø), the temperature (room temperature to 100° C.), the reactive sputtering film formation conditions, or the like. The first IGZO film has a thickness of 5 nm to 20 nm. Needless to say, when the film includes crystal grains, the size of the crystal grains does not exceed the thickness of the film. In this embodiment, the thickness of the first IGZO film is 5 nm.

The gate insulating layer, the conductive film, and the first IGZO film can be successively formed without being exposed to air by using a sputtering method and appropriately changing gases to be introduced to, or targets placed in, a chamber. Successive formation without exposure to air can prevent entry of impurities. When films are successively formed without being exposed to air, a multi-chamber manufacturing apparatus is preferably used.

Next, a second photolithography step is performed to form a resist mask, and the first IGZO film is etched. In this embodiment, by wet etching with use of ITO-07N (manufactured by KANTO CHEMICAL CO., INC.), an unnecessary portion of the first IGZO film is removed to form IGZO layers 111a and 111b. Note that etching here is not limited to wet etching and may be dry etching.

Next, with use of the same resist mask as used for the etching of the first IGZO film, an unnecessary portion is removed by etching to form a source electrode layer 105a and a drain electrode layer 105b. As an etching method at that time, wet etching or dry etching is used. In this embodiment, by dry etching using a mixed gas of $SiCl_4$, $Cl_2$, and $BCl_3$ as a reactive gas, the conductive film in which the Ti film, the Al film, and the Ti film are sequentially stacked is etched to form the source electrode layer 105a and the drain electrode layer 105b. A cross-sectional view at this stage is illustrated in FIG. 1B. Note that a top view at this stage corresponds to FIG. 4.

In the second photolithography step, a second terminal 122 made from the same material as the source electrode layer 105a and the drain electrode layer 105b is also left in the terminal portion. Note that the second terminal 122 is electrically connected to a source wiring (a source wiring including the source electrode layer 105a).

In a capacitor portion, the first IGZO film overlapping the capacitor wiring 108 is removed. In the terminal portion, an IGZO layer 123 remains which is a portion of the first IGZO film located over the second terminal 122 and overlapping the second terminal.

Next, after the resist mask is removed, plasma treatment is performed. A cross-sectional view at this stage is illustrated in FIG. 1C. In this embodiment, reverse sputtering where an oxygen gas and an argon gas are introduced and plasma is generated is performed, and an exposed portion of the gate insulating layer is irradiated with oxygen radicals or oxygen. Thus, dust attached to the surface is removed, and furthermore, the surface of the gate insulating layer is modified into an oxygen-excess region. Oxygen radical treatment which is performed on a surface of the gate insulating layer to change the surface into an oxygen-excess region is effective in forming a source of oxygen for interface modification of an IGZO layer during heat treatment (200° C. to 600° C.) for reliability improvement in a later step.

Note that under certain conditions of plasma treatment, an oxide film (not illustrated) is formed on exposed side faces of the source electrode layer 105a and the drain electrode layer 105b, but it can be said that this does not cause a problem because the source electrode layer 105a and the drain electrode layer 105b are not in direct contact with a channel formation region in this structure. Instead, this oxide film enables a structure in which the source electrode layer 105a and the drain electrode layer 105b are in contact with a channel formation region with a source region and a drain region interposed therebetween. In addition, plasma treatment is performed after a source region and a drain region are formed over the source electrode layer and the drain electrode layer; thus, only exposed edge portions of the source electrode layer and the drain electrode layer are oxidized. Accordingly, only regions of the source electrode layer and the drain electrode layer in contact with the semiconductor layer are oxidized, and the other regions are not oxidized and the resistance thereof can thus be kept low. In addition, the contact area between the source and drain regions and the semiconductor layer is large, and the source region or the drain region can be electrically connected to the semiconductor layer.

Next, after the plasma treatment, a second oxide semiconductor film (in this embodiment, a second IGZO film) is formed without exposure to air. Formation of the second IGZO film without exposure to air after the plasma treatment is effective in preventing dust and moisture from attaching to the interface between the gate insulating layer and the semiconductor film. In this embodiment, the second IGZO film is formed in an argon or oxygen atmosphere using an oxide semiconductor target containing In, Ga, and Zn and having a diameter of 8 inches ($In_2O_3:Ga_2O_3:ZnO=1:1:1$), with the distance between the substrate and the target set to 170 mm, under a pressure of 0.4 Pa, and with a direct-current (DC) power source of 0.5 kW. Note that it is preferable to use a pulsed direct-current (DC) power source with which dust can be reduced and thickness distribution can be evened. The second IGZO film has a thickness of 5 nm to 200 nm. In this embodiment, the thickness of the second IGZO film is 100 nm.

By forming the second IGZO film under film formation conditions different from those for the first IGZO film, the second IGZO film is made to contain oxygen at a higher concentration than that in the first IGZO film. For example, the second IGZO film is formed under conditions where the ratio of an oxygen gas flow rate is higher than the ratio of an oxygen gas flow rate to an argon gas flow rate under the film formation conditions for the first IGZO film. Specifically, the first IGZO film is formed in a rare gas (such as argon or helium) atmosphere (or an oxygen gas of 10% or less and an argon gas of 90% or more), and the second IGZO film is formed in an oxygen atmosphere (or in an argon gas-to-oxygen gas flow ratio of 1:1 or higher). By making the second IGZO film contain a larger amount of oxygen, the conductivity can be made lower than that of the first IGZO film. In addition, by making the second IGZO film contain a larger amount of oxygen, off-current can be reduced; thus, a thin film transistor having high on-off ratio can be obtained.

The second IGZO film may be formed in the same chamber as that in which reverse sputtering has been performed, or may be formed in a chamber different from that in which reverse sputtering has been performed as long as it can be formed without exposure to air.

Next, heat treatment is preferably performed at 200° C. to 600° C., typically, 300° C. to 500° C. In this embodiment, heat treatment is performed in a nitrogen atmosphere in a furnace at 350° C. for 1 hour. Through this heat treatment, rearrangement at the atomic level occurs in the IGZO film. Because strain energy which inhibits carrier movement is released by the heat treatment, the heat treatment (including optical annealing) is important. Note that the timing of heat treatment is not particularly limited as long as it is after formation of the second IGZO film, and for example, heat treatment may be performed after formation of a pixel electrode.

Next, a third photolithography step is performed to form a resist mask, and an unnecessary portion is removed by etching to form an IGZO semiconductor layer 103. In this embodiment, the second IGZO film is removed by wet etching with use of ITO-07N (KANTO CHEMICAL CO., INC.) to form the IGZO semiconductor layer 103. Note that the same etchant is used for the first IGZO film and the second IGZO film; thus, by this etching, the first IGZO film is removed. Accordingly, a side face of the first IGZO film covered with the second IGZO film is protected, whereas an exposed portion of the first IGZO film (the IGZO layers 111a and 111b) is etched and a source region 104a and a drain region 104b are formed. Note that the etching for the IGZO semiconductor layer 103 is not limited to wet etching and may be dry etching. Through the above steps, a thin film transistor 170 including the IGZO semiconductor layer 103 as a channel formation region can be manufactured. A cross-sectional view at this stage is illustrated in FIG. 2A. Note that a top view at this stage corresponds to FIG. 5.

Next, the resist mask is removed, and a protective insulating film 107 is formed to cover the IGZO semiconductor layer. As the protective insulating film 107, a silicon nitride film, a silicon oxide film, a silicon oxynitride film, an aluminum oxide film, a tantalum oxide film, or the like which is obtained by a sputtering method or the like can be used.

Next, a fourth photolithography step is performed to form a resist mask, and the protective insulating film 107 is etched to form a contact hole 125 reaching the drain electrode layer 105b. In addition, by this etching, a contact hole 127 reaching the second terminal 122 is also formed. Note that in order to reduce the number of masks, it is preferable to further etch the gate insulating layer using the same resist mask so that a contact hole 126 reaching the gate electrode is also formed using the same resist mask. A cross-sectional view at this stage is illustrated in FIG. 2B.

Then, after the resist mask is removed, a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, because a residue tends to be generated particularly in etching of ITO, an alloy of indium oxide and zinc oxide ($In_2O_3$—ZnO) may be used in order to improve etching processability.

Next, a fifth photolithography step is performed to form a resist mask, and an unnecessary portion is removed by etching to form a pixel electrode 110.

In the fifth photolithography step, a storage capacitor is formed with the capacitor wiring 108 and the pixel electrode 110, in which the gate insulating layer 102 and the protective insulating film 107 in the capacitor portion are used as a dielectric.

In addition, in the fifth photolithography step, the first terminal and the second terminal are covered with the resist mask, and transparent conductive films 128 and 129 are left in the terminal portion. The transparent conductive films 128 and 129 serve as electrodes or wirings that are used for connection with an FPC. The transparent conductive film 129 formed over the second terminal 122 is a connection terminal electrode which functions as an input terminal of the source wiring.

Then, the resist mask is removed, and a cross-sectional view at this stage is illustrated in FIG. 2C. Note that a top view at this stage corresponds to FIG. 6.

Figure 7A:
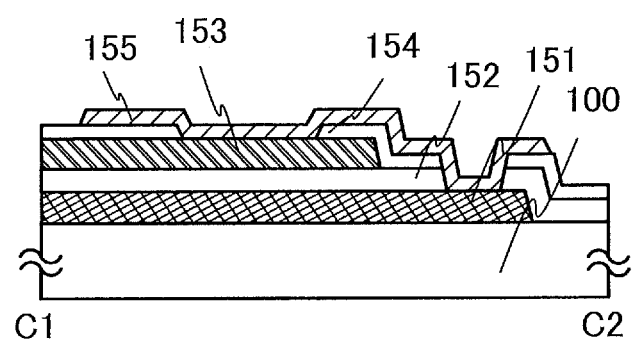
FIGS. 7A to 7D illustrate a semiconductor device.
Figure 7B:
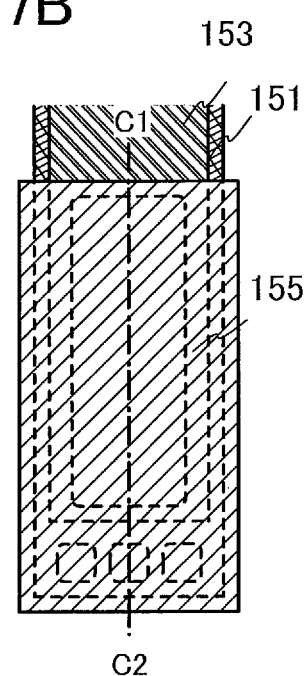

FIGS. 7A and 7B illustrate a top view of a gate wiring terminal portion at this stage and a cross-sectional view thereof, respectively. FIG. 7A corresponds to a cross-sectional view taken along a line C1-C2 in FIG. 7B. In FIG. 7A, a transparent conductive film 155 formed over a protective insulating film 154 is a connection terminal electrode which functions as an input terminal. In the terminal portion in FIG. 7A, a first terminal 151 formed from the same material as the gate wiring and a connection electrode 153 formed from the same material as the source wiring overlap each other with a gate insulating layer 152 interposed therebetween and are electrically connected by the transparent conductive film 155. Note that a portion where the transparent conductive film 128 and the first terminal 121 illustrated in FIG. 2C are in contact with each other corresponds to a portion where the transparent conductive film 155 and the first terminal 151 are in contact with each other in FIG. 7A.

Figure 7C:
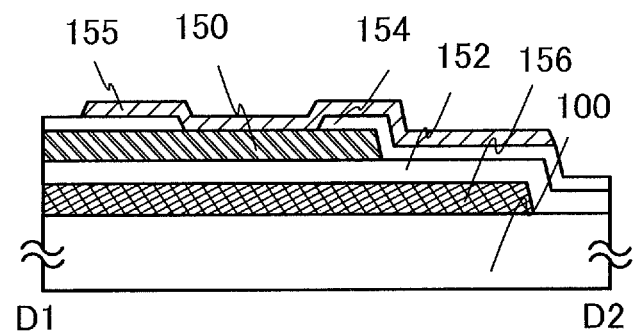
Figure 7D:
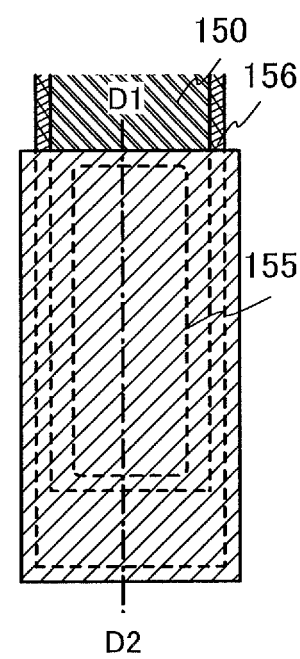

FIGS. 7C and 7D illustrate a top view of a source wiring terminal portion which is different from the source wiring terminal portion illustrated in FIG. 2C and a cross-sectional view thereof, respectively. FIG. 7C corresponds to a cross-sectional view taken along a line D1-D2 in FIG. 7D. In FIG. 7C, a transparent conductive film 155 formed over a protective insulating film 154 is a connection terminal electrode which functions as an input terminal. In the terminal portion in FIG. 7C, an electrode 156 formed from the same material as the gate wiring is located below and overlapped by a second terminal 150 electrically connected to the source wiring with a gate insulating layer 102 interposed therebetween. The electrode 156 is not electrically connected to the second terminal 150, and if the electrode 156 is set at a different potential from the second terminal 150, such as floating, GND, or 0 V, a capacitor as a measure against noise or a capacitor as a measure against static electricity can be formed. The second terminal 150 is electrically connected to the transparent conductive film 155 by the protective insulating film 154.

A plurality of gate wirings, source wirings, and capacitor wirings are provided in accordance with pixel density. In the terminal portion, a plurality of first terminals at the same potential as gate wirings, second terminals at the same potential as source wirings, third terminals at the same potential as capacitor wirings, or the like are arranged. The number of terminals of each type may be optionally determined by a practitioner as appropriate.

By these five photolithography steps, using five photomasks, a pixel thin film transistor portion including the thin film transistor 170 that is a bottom-gate n-channel thin film transistor, and a storage capacitor can be completed. These are arranged in matrix in respective pixels so that a pixel portion is formed, which can be used as one of substrates for manufacturing an active matrix display device. In this specification, such a substrate is referred to as an active matrix substrate for convenience.

In the case of manufacturing an active matrix liquid crystal display device, a liquid crystal layer is provided between an active matrix substrate and a counter substrate provided with a counter electrode, and the active matrix substrate and the counter substrate are fixed to each other. Note that a common electrode is provided over the active matrix substrate to be electrically connected to the counter electrode provided over the counter substrate, and a fourth terminal is provided in a terminal portion to be electrically connected to the common electrode. This fourth terminal is a terminal for setting the common electrode at a fixed potential such as GND or 0 V.

Figure 6:
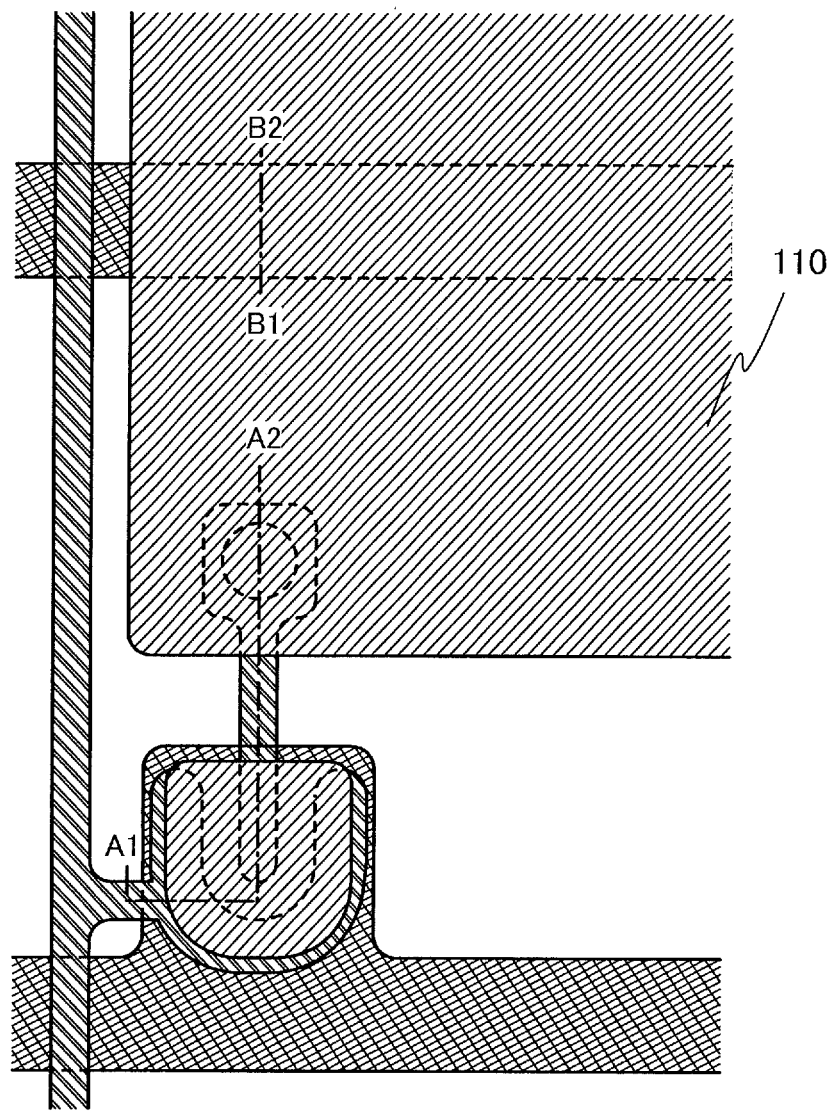
FIG. 6 illustrates a semiconductor device.
Figure 8:
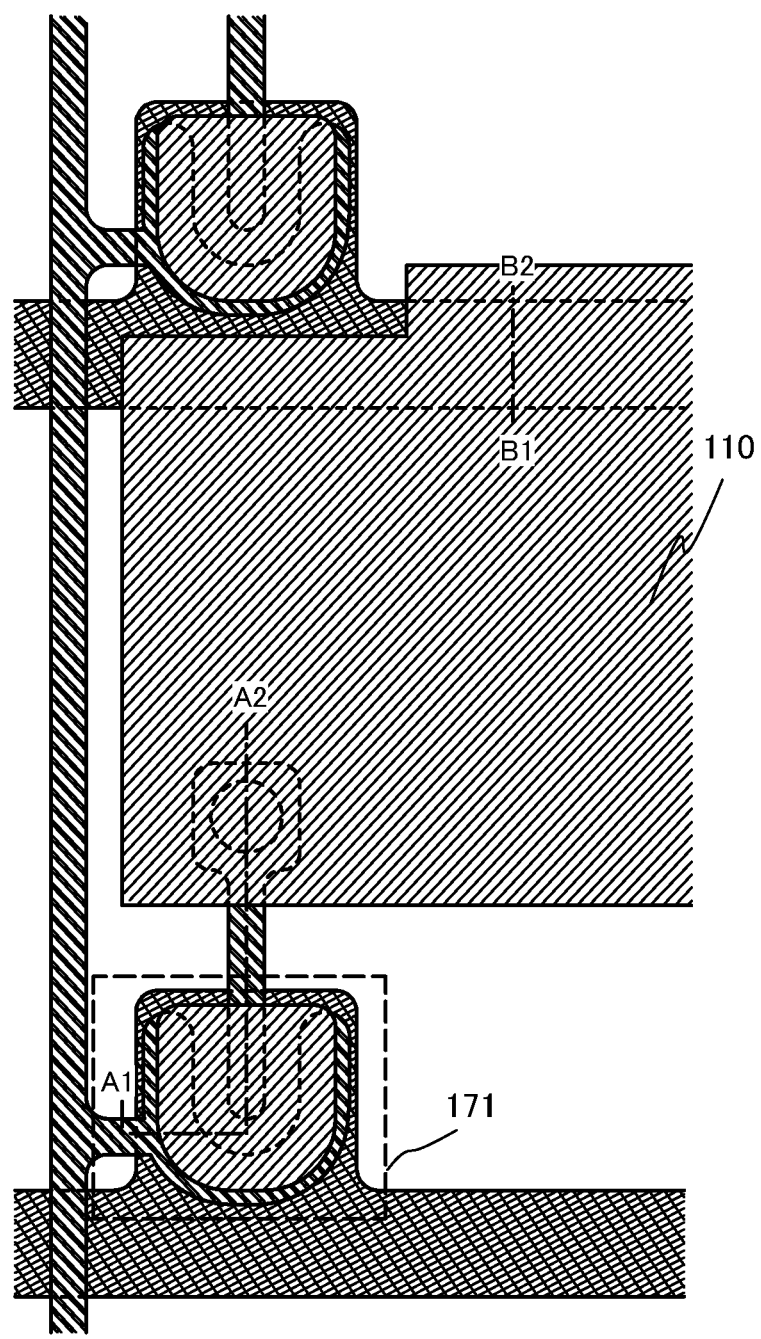
FIG. 8 illustrates a semiconductor device.

A pixel structure is not limited to that of FIG. 6, and an example of a top view different from FIG. 6 is illustrated in FIG. 8. FIG. 8 illustrates an example in which a capacitor wiring is not provided and a storage capacitor is formed with a pixel electrode and a gate wiring of an adjacent pixel which overlap each other with a protective insulating film and a gate insulating layer interposed therebetween. In this case, the capacitor wiring and the third wiring connected to the capacitor wiring can be omitted. Note that in FIG. 8, the same portions as those in FIG. 6 are denoted by the same reference numerals.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique which is so-called black insertion by which an entirely black image is displayed every other frame.

Further, there is another driving technique which is so-called double-frame rate driving. In the double-frame rate driving, a normal vertical cycle is set 1.5 times or more or 2 times or more, whereby moving image characteristics are improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lightning in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

The n-channel transistor obtained in this embodiment includes an IGZO semiconductor layer as a channel formation region and has excellent dynamic characteristics; thus, it can be combined with these driving techniques.

In the case of manufacturing a light-emitting display device, one electrode (also called a cathode) of an organic light-emitting element is set at a low power supply potential such as GND or 0 V; thus, a fourth terminal for setting the cathode at a low power supply potential such as GND or 0 V is provided in a terminal portion. In addition, in the case of manufacturing a light-emitting display device, besides a source wiring and a gate wiring, a power supply line is provided. Accordingly, a fifth terminal which is electrically connected to the power supply line is provided in a terminal portion.

According to this embodiment, a thin film transistor with small photoelectric current, small parasitic capacitance, and high on-off ratio can be obtained, so that a thin film transistor having excellent dynamic characteristics can be manufactured. Therefore, a semiconductor device which includes thin film transistors having excellent electrical characteristics and high reliability can be provided.

Embodiment 2

In this embodiment, an example is described, in which source regions and drain regions are provided above and below a source electrode layer and a drain electrode layer in the thin film transistor of Embodiment 1. A thin film transistor having a structure different from that in Embodiment 1 and a manufacturing process thereof are described with reference to FIGS. 9A to 9C and FIGS. 10A to 10C.

This embodiment only partly differs from Embodiment 1; thus, the same portions as those in FIGS. 1A to 1C, FIGS. 2A to 2C, FIGS. 3 to 6, FIGS. 7A to 7D, and FIG. 8 are denoted by the same reference numerals and repetitive description of the same steps is omitted in the following description.

First, in a similar manner to Embodiment 1, a conductive layer is formed over a substrate 100, a first photolithography step is performed to form a resist mask, and an unnecessary portion is removed by etching to form wirings and an electrode (a gate wiring including a gate electrode 101, a capacitor wiring 108, and a first terminal 121). A cross-sectional view at this stage is FIG. 9A, and FIG. 9A is identical to FIG. 1A. Thus, the top view in FIG. 3 corresponds to FIG. 9A.

Next, in a similar manner to Embodiment 1, a gate insulating layer 102 is formed over the entire area over the gate electrode 101. The gate insulating layer 102 is formed by a sputtering method or the like to a thickness of 50 nm to 250 nm. For example, the gate insulating layer 102 is formed using a silicon oxide film with a thickness of 110 nm by a sputtering method.

Next, a first oxide semiconductor film (in this embodiment, a first IGZO film) is formed over the gate insulating layer 102 by a sputtering method. In this embodiment, sputtering is performed using a target of $In_2O_3:Ga_2O_3:ZnO=1:1:1$ under film formation conditions where the pressure is 0.4 Pa, the power is 500 W, the formation temperature is room temperature, and an argon gas is introduced at a flow rate of 40 sccm. Despite the intentional use of the target of $In_2O_3:Ga_2O_3:ZnO=1:1:1$, an IGZO film including crystal grains with a size of 1 nm to 10 nm immediately after the film formation may be obtained. Note that it can be said that the presence or absence of crystal grains or the density of crystal grains can be adjusted and the diameter size can be adjusted within the range of 1 nm to 10 nm by appropriate adjustment of the composition ratio in the target, the film formation pressure (0.1 Pa to 2.0 Pa), the power (250 W to 3000 W: 8 inches ø), the temperature (room temperature to 100° C.), the reactive sputtering film formation conditions, or the like. The first IGZO film has a thickness of 5 nm to 20 nm. Needless to say, when the film includes crystal grains, the size of the crystal grains does not exceed the thickness of the film. In this embodiment, the thickness of the first IGZO film is 5 nm.

Next, a conductive film made from a metal material is formed over the first IGZO film by a sputtering method or a vacuum evaporation method. As examples of a material of the conductive film, an element selected from Al, Cr, Ta, Ti, Mo, and W, an alloy containing any of the elements as its component, an alloy containing any of the elements in combination, and the like can be given. In this embodiment, the conductive film has a three-layer structure in which a Ti film is formed, an aluminum (Al) film is stacked over the Ti film, and a Ti film is further formed thereover. Alternatively, the conductive film may have a two-layer structure and a titanium film may be stacked over an aluminum film. Still alternatively, the conductive film may have a single-layer structure of an aluminum film containing silicon or a single-layer structure of a titanium film.

Next, a second oxide semiconductor film (in this embodiment, a second IGZO film) is formed over the conductive film by a sputtering method. This second IGZO film can be formed under the same film formation conditions as those for the first IGZO film. As the second IGZO film, an IGZO film which may include crystal grains with a size of 1 nm to 10 nm immediately after film formation is used. The second IGZO film has a thickness of 5 nm to 20 nm. In this embodiment, the thickness of the second IGZO film is 5 nm.

The gate insulating layer, the first IGZO film, the conductive film, and the second IGZO film can be successively formed without being exposed to air by using a sputtering method and appropriately changing gases to be introduced to, or targets placed in, a chamber. Successive formation without exposure to air can prevent entry of impurities. When films are successively formed without being exposed to air, a multi-chamber manufacturing apparatus is preferably used.

Next, a second photolithography step is performed to form a resist mask over the second IGZO film, and an unnecessary portion is removed by etching to form a first source region 106a and a first drain region 106b, a source electrode layer 105a and a drain electrode layer 105b, and IGZO layers 111a and 111b which are formed from the second IGZO film. As an etching method at this time, wet etching or dry etching is used. Here, after the IGZO layers 111a and 111b are formed by wet etching with use of ITO-07N (manufactured by KANTO CHEMICAL Co., INC.), the conductive film in which the Ti film, the Al film, and the Ti film are sequentially stacked is etched by dry etching using a mixed gas of $SiCl_4$, $Cl_2$, and $BCl_3$ as a reactive gas to form the source electrode layer 105a and the drain electrode layer 105b. After that, using the same resist mask, the first source region 106a and the first drain region 106b are formed by wet etching with use of ITO-07N (manufactured by KANTO CHEMICAL Co., INC.). A cross-sectional view at this stage is illustrated in FIG. 9B. Note that a top view at this stage corresponds to FIG. 4.

In a capacitor portion, a portion of the first IGZO film and the second IGZO film overlapping the capacitor wiring 108 is removed. In a terminal portion, an IGZO layer 123 which is a portion of the second IGZO film remains over the second terminal 122. In addition, an IGZO layer 130 remains which is a portion of the first IGZO film located under the second terminal 122 and overlapped by the second terminal.

Next, after the resist mask is removed, plasma treatment is performed. A cross-sectional view at this stage is illustrated in FIG. 9C. In this embodiment, reverse sputtering where an oxygen gas and an argon gas are introduced and plasma is generated is performed, and an exposed portion of the gate insulating layer is irradiated with oxygen radicals or oxygen. Thus, dust attached to the surface is removed, and furthermore, the surface of the gate insulating layer is modified into an oxygen-excess region. Oxygen radical treatment which is performed on a surface of the gate insulating layer to change the surface into an oxygen-excess region is effective in forming a source of oxygen for interface modification of an IGZO semiconductor layer during heat treatment (200° C. to 600° C.) for reliability improvement in a later step.

Because the IGZO layers 111a and 111b are provided over the source electrode layer 105a and the drain electrode layer 105b, plasma damage can be reduced. In addition, because the IGZO layers 111a and 111b are provided, an increase in wiring resistance due to oxidation of the source electrode layer 105a and the drain electrode layer 105b can be suppressed.

Note that under certain conditions of plasma treatment, an oxide film (not illustrated) is formed on exposed side faces of the source electrode layer 105a and the drain electrode layer 105b, but it can be said that this does not cause a problem because the source electrode layer 105a and the drain electrode layer 105b are not in direct contact with a channel formation region in this structure. Instead, this oxide film enables a structure in which the source electrode layer 105a and the drain electrode layer 105b are in contact with a channel formation region with a source region and a drain region interposed therebetween.

Next, after the plasma treatment, a third oxide semiconductor film (in this embodiment, a third IGZO film) is formed without exposure to air. Formation of the third IGZO film after the plasma treatment without exposure to air is effective in preventing dust and moisture from attaching to the interface between the gate insulating layer and the semiconductor film. In this embodiment, the third IGZO film is formed in an argon or oxygen atmosphere using an oxide semiconductor target containing In, Ga, and Zn and having a diameter of 8 inches ($In_2O_3$:$Ga_2O_3$:ZnO=1:1:1), with the distance between the substrate and the target set to 170 mm, under a pressure of 0.4 Pa, and with a direct-current (DC) power source of 0.5 kW. Note that it is preferable to use a pulsed direct-current (DC) power source with which dust can be reduced and thickness distribution can be evened. The third IGZO film has a thickness of 5 nm to 200 nm. In this embodiment, the thickness of the third IGZO film is 100 nm.

By forming the third IGZO film under film formation conditions different from those for the first and second IGZO films, the third IGZO film is made to contain oxygen at a higher concentration than those in the first and second IGZO films. For example, the third IGZO film is formed under conditions where the ratio of an oxygen gas flow rate is higher than the ratio of an oxygen gas flow rate to an argon gas flow rate under the film formation conditions for the first and second IGZO films.

Specifically, the first and second IGZO films are formed in a rare gas (such as argon or helium) atmosphere (or an oxygen gas of 10% or less and an argon gas of 90% or more), and the third IGZO film is formed in an oxygen atmosphere (or in an argon gas-to-oxygen gas flow ratio of 1:1 or higher).

By making the third IGZO film contain a larger amount of oxygen, the conductivity can be made lower than those of the first and second IGZO films. In addition, by making the third IGZO film contain a larger amount of oxygen, off-current can be reduced; thus, a thin film transistor having high on-off ratio can be obtained.

The third IGZO film may be formed in the same chamber as that in which reverse sputtering has been performed, or may be formed in a chamber different from that in which reverse sputtering has been performed as long as it can be formed without exposure to air.

Next, heat treatment is preferably performed at 200° C. to 600° C., typically, 300° C. to 500° C. In this embodiment, heat treatment is performed in a nitrogen atmosphere in a furnace at 350° C. for 1 hour. Through this heat treatment, rearrangement at the atomic level occurs in the IGZO film. Because strain energy which inhibits carrier movement is released by the heat treatment, the heat treatment (including optical annealing) is important. Note that the timing of heat treatment is not particularly limited as long as it is after formation of the third IGZO film, and for example, heat treatment may be performed after formation of a pixel electrode.

Next, a third photolithography step is performed to form a resist mask, and an unnecessary portion is removed by etching to form an IGZO semiconductor layer 103. Through the above steps, a thin film transistor 171 including the IGZO semiconductor layer 103 as a channel formation region can be manufactured. A cross-sectional view at this stage is illustrated in FIG. 10A. Note that a top view at this stage corresponds to FIG. 5. In this embodiment, the third IGZO film is removed by wet etching with use of ITO-07N (KANTO CHEMICAL CO., INC.) to form the IGZO semiconductor layer 103. Note that the same etchant is used for the first IGZO film, the second IGZO film, and the third IGZO film; thus, by this etching, a part of the first IGZO film and a part of the second IGZO film are removed. Remaining portions of the second IGZO film covered with the third IGZO film serve as a second source region 104a and a second drain region 104b. A side face of the first IGZO film covered with the third IGZO film is protected, whereas the other side face of the first IGZO film is exposed and slightly etched and the shape of the end face is changed as illustrated in FIG. 10A. Note that etching for the IGZO semiconductor layer 103 is not limited to wet etching and may be dry etching.

In addition, by the etching at this time, in the terminal portion, the IGZO layer 123 provided over the second terminal 122 and formed from the second IGZO film is removed.

Next, in a similar manner to Embodiment 1, a protective insulating film 107 is formed to cover the IGZO semiconductor layer. Subsequent steps are similar to those in Embodiment 1 and are thus described briefly here.

After the protective insulating film 107 is formed, a fourth photolithography step is performed to form a resist mask, and the protective insulating film 107 is etched to form contact holes 125, 126, and 127. A cross-sectional view at this stage is illustrated in FIG. 10B.

Then, after the resist mask is removed, a transparent conductive film is formed. Next, a fifth photolithography step is performed to form a resist mask, and an unnecessary portion is removed by etching to form a pixel electrode 110 and leave transparent conductive films 128 and 129 in the terminal portion. Then, the resist mask is removed, and a cross-sectional view at this stage is illustrated in FIG. 10C. Note that a top view at this stage corresponds to FIG. 6.

By these five photolithography steps, using five photomasks, a pixel thin film transistor portion including the thin film transistor 171 that is a bottom-gate n-channel thin film transistor, and a storage capacitor can be completed.

In the n-channel thin film transistor 171 described in this embodiment, a plurality of source regions and a plurality of drain regions are provided and on-current can be increased compared to Embodiment 1.

The thin film transistor described in this embodiment includes source and drain regions (oxygen-deficient oxide semiconductor layers containing In, Ga, and Zn) and has a structure in which the gate electrode layer, the gate insulating layer, the source and drain regions (oxygen-deficient oxide semiconductor layers containing In, Ga, and Zn), the source and drain electrode layers, and the semiconductor layer (an oxygen-excess oxide semiconductor layer containing In, Ga, and Zn) are stacked. Thus, the distance between the gate electrode layer and the source and drain electrode layers is large, and accordingly, parasitic capacitance can be suppressed even if the semiconductor layer has a small thickness.

Note that this embodiment can be freely combined with Embodiment 1.

Embodiment 3

In this embodiment, an example will be described below, in which at least part of a driver circuit and a thin film transistor arranged in a pixel portion are formed over the same substrate in a display device which is one example of a semiconductor device of the present invention.

The thin film transistor to be arranged in the pixel portion is formed according to Embodiment 1 or 2. Further, the thin film transistor described in Embodiment 1 or 2 is an n-channel TFT, and thus a part of a driver circuit that can include an n-channel TFT among driver circuits is formed over the same substrate as the thin film transistor of the pixel portion.

Figure 12A:
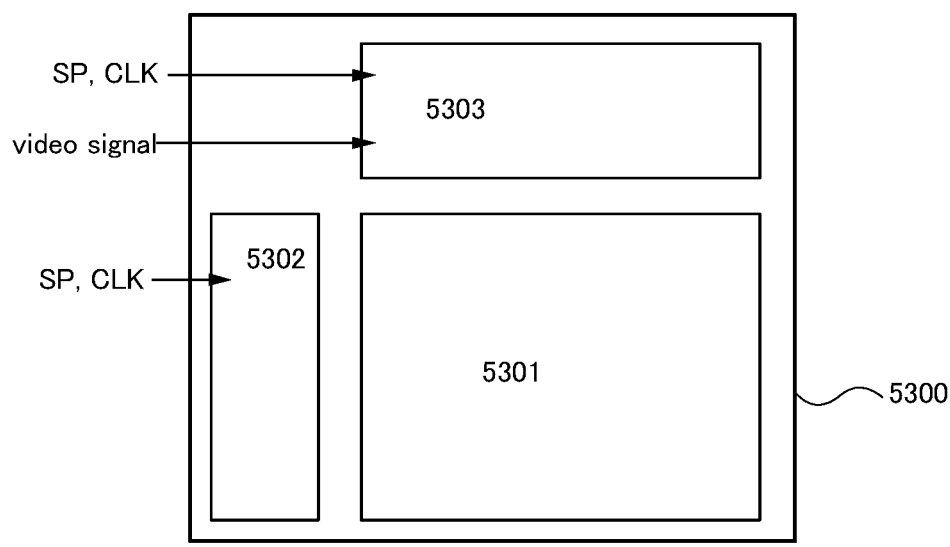
FIGS. 12A and 12B are block diagrams each illustrating a semiconductor device.

FIG. 12A illustrates an example of a block diagram of an active matrix liquid crystal display device which is an example of a semiconductor device of the present invention. The display device illustrated in FIG. 12A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor described in Embodiment 1 or 2 is an n-channel TFT, and a signal line driver circuit including the n-channel TFT is described with reference to FIG. 13.

Figure 13:
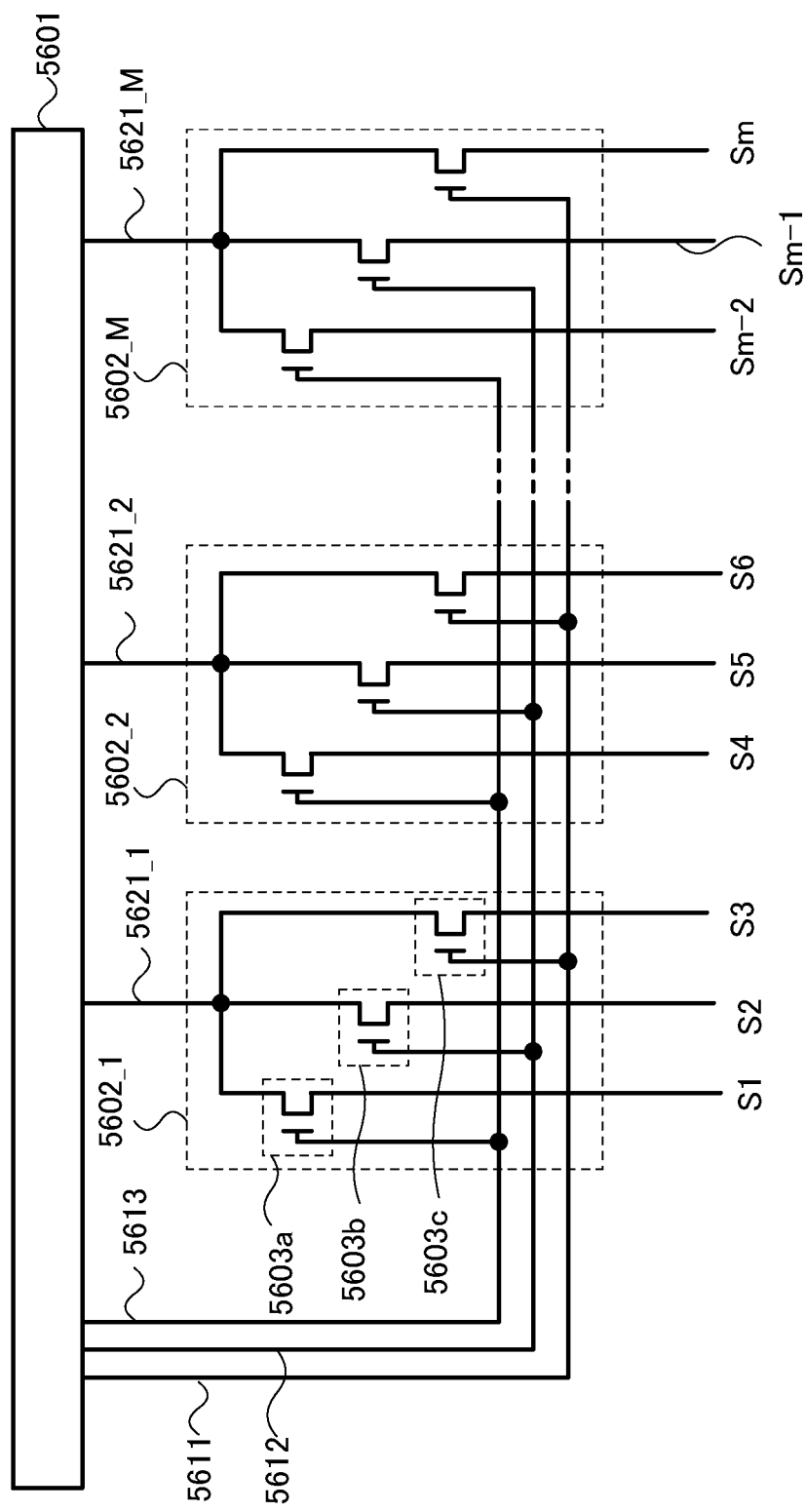
FIG. 13 illustrates a configuration of a signal line driver circuit.

The signal line driver circuit illustrated in FIG. 13 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed over a single crystalline substrate. The switch groups 5602_1 to 5602_M are preferably formed over the same substrate as the pixel portion is. Therefore, the driver IC 5601 and the switch groups 5602_1 to 5602_M are preferably connected through an FPC or the like.

Figure 14:
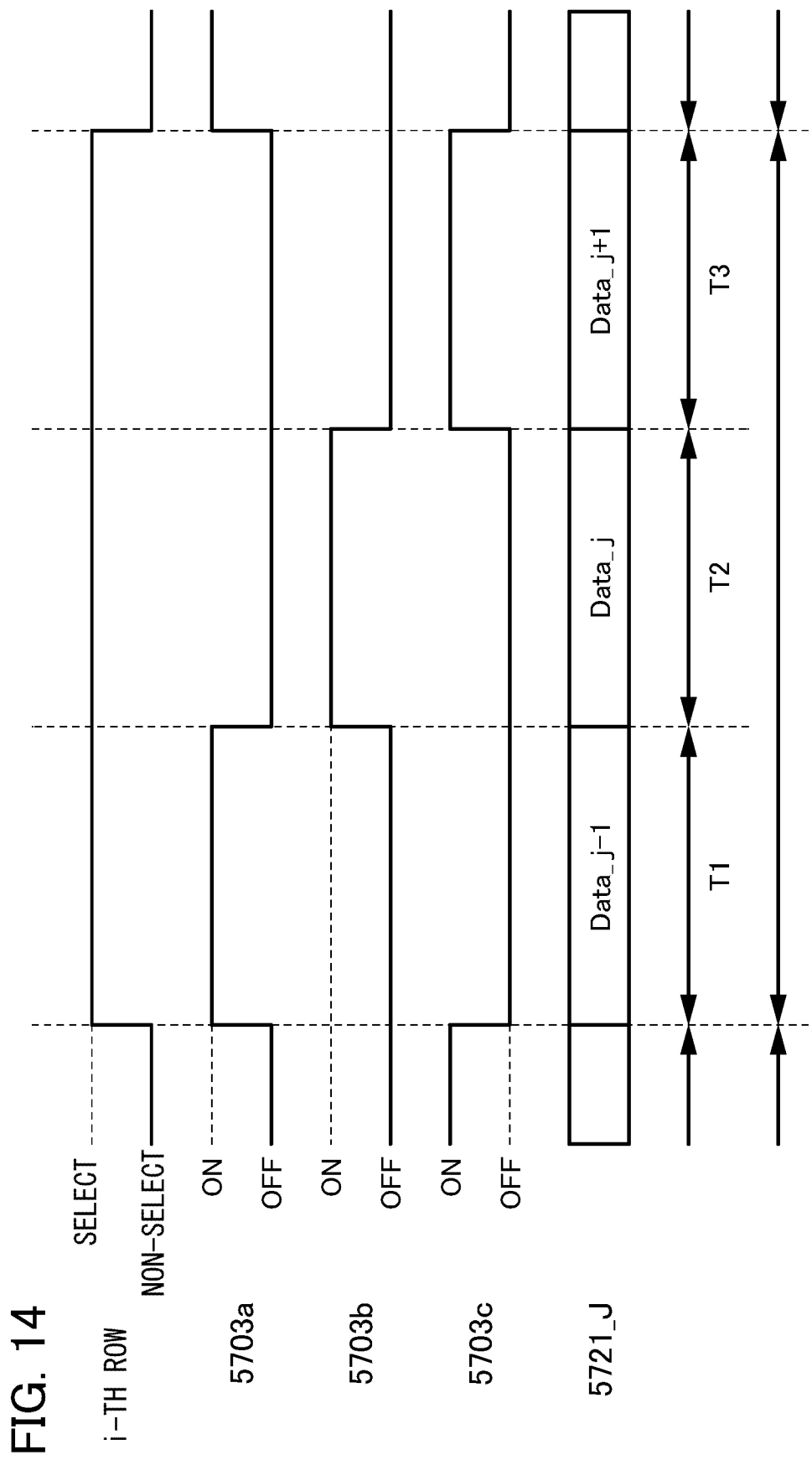
FIG. 14 is a timing chart illustrating operation of a signal line driver circuit.

Next, operation of the signal line driver circuit illustrated in FIG. 13 is described with reference to a timing chart in FIG. 14. The timing chart in FIG. 14 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 13 operates similarly to that in FIG. 14 even when a scan line of another row is selected.

Note that the timing chart in FIG. 14 shows a case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 14 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As illustrated in FIG. 14, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 13, by dividing one gate selection period into three, video signals can be input to three signal lines from one wiring 5621 in one gate selection period. Therefore, in the signal line driver circuit in FIG. 13, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 13 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 13.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes short. Therefore, one gate selection period is preferably divided into two or three sub-selection periods.

Figure 15:
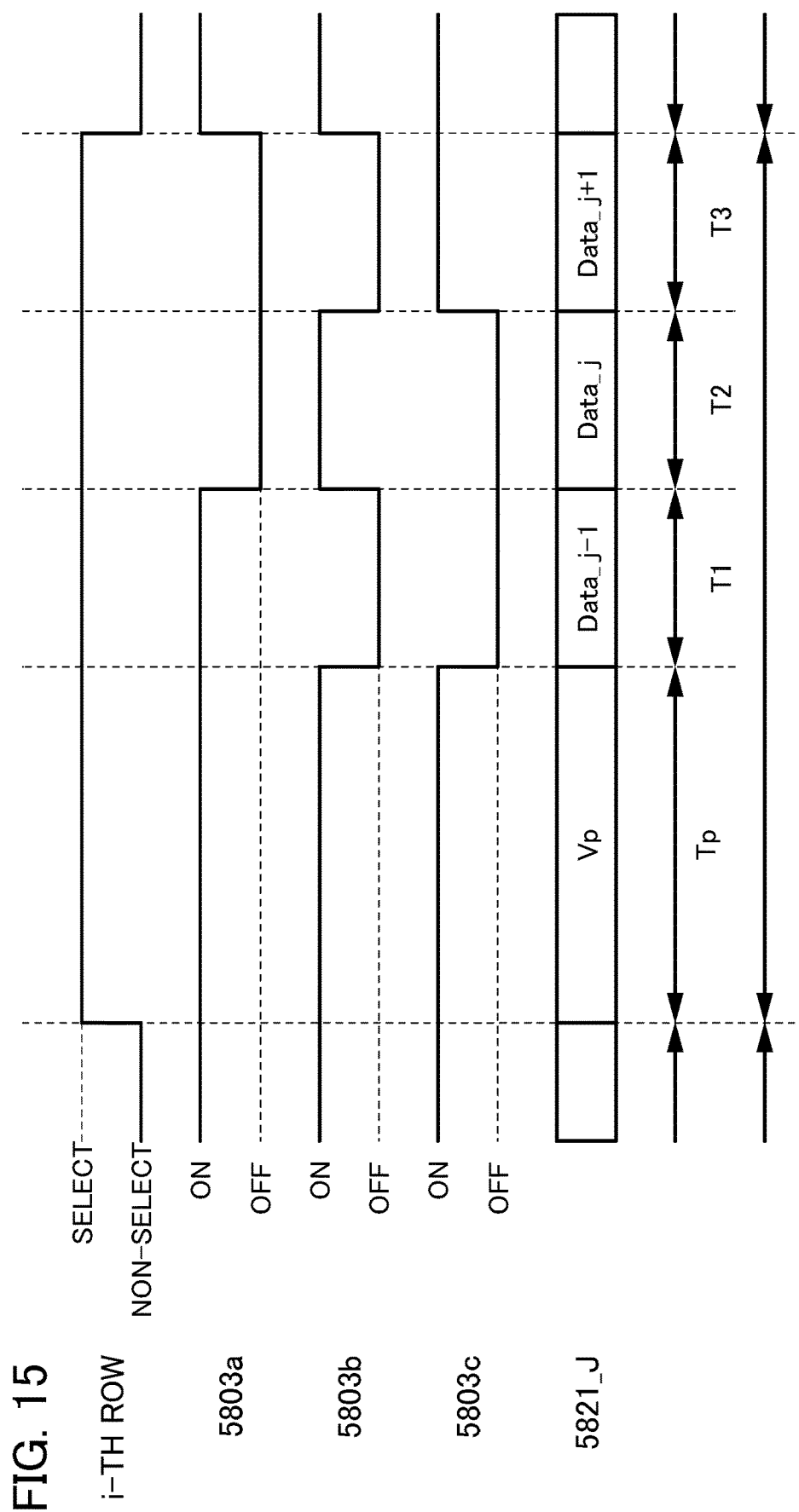
FIG. 15 is a timing chart illustrating operation of a signal line driver circuit.

As another example, one gate selection period may be divided into a precharge period Tp, the first sub-selection period T1, the second sub-selection period T2, and the third sub-selection period T3 as illustrated in a timing chart in FIG. 15. The timing chart in FIG. 15 illustrates timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 15, the first thin film transistor 5603a, the second thin film transistor 5603b, and the third thin film transistor 5603c are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 13 to which the timing chart in FIG. 15 is applied, the video signal can be written to the pixel at high speed because the signal line can be precharged by providing a precharge selection period before a sub-selection period. Note that portions in FIG. 15 which are similar to those of FIG. 14 are denoted by common reference numerals and detailed description of the same portions and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The selection signal produced is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large current is used.

One mode of a shift register which is used for a part of a scan line driver circuit is described with reference to FIG. 16 and FIG. 17.

Figure 16:
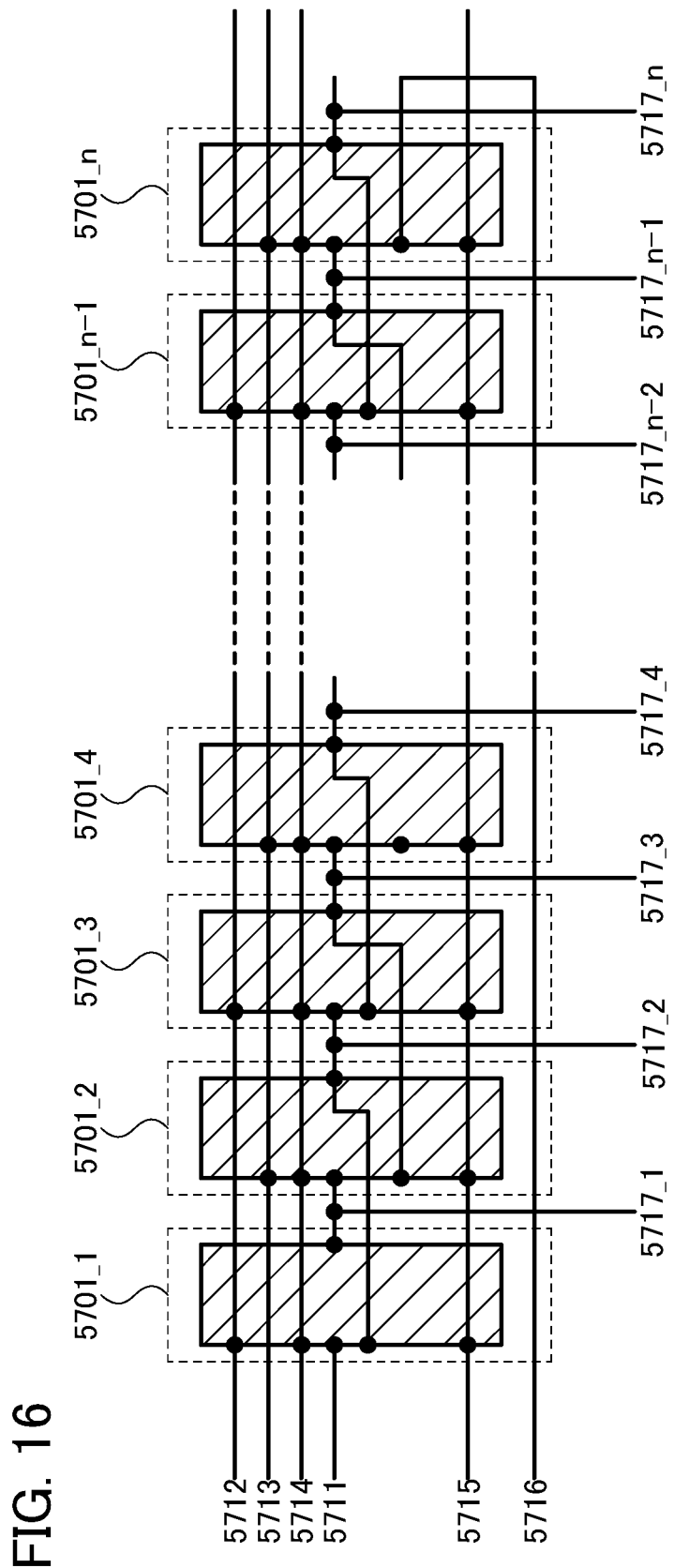
FIG. 16 illustrates a configuration of a shift register.

FIG. 16 illustrates a circuit configuration of the shift register. The shift register illustrated in FIG. 16 includes a plurality of flip-flops (flip-flops 5701_1 to 5701_n). The shift register is operated with input of a first clock signal, a second clock signal, a start pulse signal, and a reset signal.

Connection relations of the shift register in FIG. 16 are described. In the i-th stage flip-flop 5701_i (one of the flip-flops 5701_1 to 5701_n) in the shift register of FIG. 16, a first wiring 5501 illustrated in FIG. 17 is connected to a seventh wiring 5717_i−1; a second wiring 5502 illustrated in FIG. 17 is connected to a seventh wiring 5717_i+1; a third wiring 5503 illustrated in FIG. 17 is connected to a seventh wiring 5717_i; and a sixth wiring 5506 illustrated in FIG. 17 is connected to a fifth wiring 5715.

Figure 17:
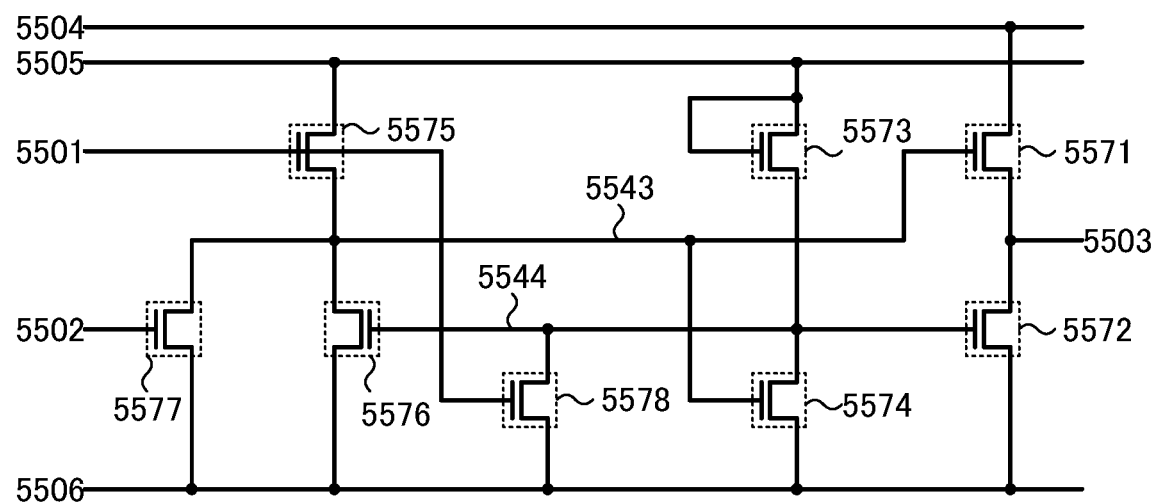
FIG. 17 illustrates a connection of a flip-flop illustrated in FIG. 16.

Further, a fourth wiring 5504 illustrated in FIG. 17 is connected to a second wiring 5712 in flip-flops of odd-numbered stages, and is connected to a third wiring 5713 in flip-flops of even-numbered stages. A fifth wiring 5505 illustrated in FIG. 17 is connected to a fourth wiring 5714.

Note that the first wiring 5501 of the first stage flip-flop 5701_1 illustrated in FIG. 17 is connected to a first wiring 5711. Moreover, the second wiring 5502 of the n-th stage flip-flop 5701_n illustrated in FIG. 17 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 17 illustrates details of the flip-flop illustrated in FIG. 16. A flip-flop illustrated in FIG. 17 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connections of the flip-flop illustrated in FIG. 16 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in Embodiment 1 or 2. The n-channel TFT described in Embodiment 1 or 2 has a high mobility, and thus a driving frequency of a driver circuit can be increased. Further, parasitic capacitance is reduced by the source or drain region which is an oxygen-deficient oxide semiconductor layer containing indium, gallium, and zinc; thus, the n-channel TFT described in Embodiment 1 or 2 has high frequency characteristics (referred to as f characteristics). For example, a scan line driver circuit using the n-channel TFT described in Embodiment 1 or 2 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, increase in frame frequency can be realized.

Figure 12B:
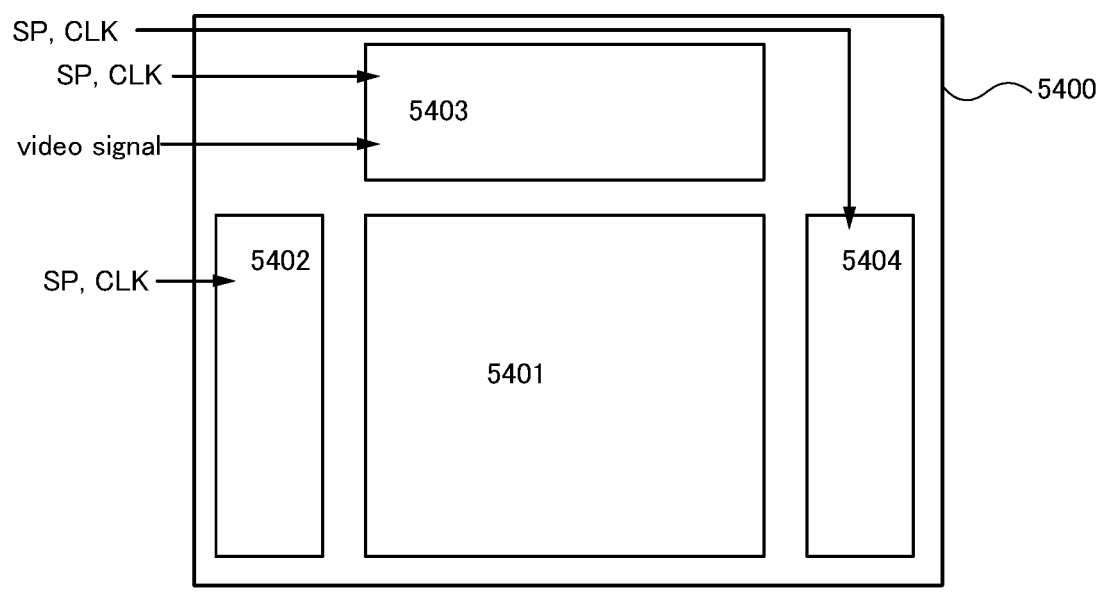

Further, when an active matrix light-emitting display device which is an example of a semiconductor device of the present invention is manufactured, a plurality of thin film transistors are arranged in at least one pixel, and thus a plurality of scan line driver circuits are preferably arranged. FIG. 12B is a block diagram illustrating an example of an active matrix light-emitting display device.

The light-emitting display device illustrated in FIG. 12B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 12B is a digital signal, a pixel is in a light-emitting state or in a non-light-emitting state by switching of ON/OFF of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. A time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of displaying with a time gray scale method, one frame period is divided into a plurality of subframe periods. Then, in accordance with video signals, the light-emitting element in the pixel is set in a light-emitting state or in a non-light-emitting state during each subframe period. By dividing one frame into a plurality of subframes, the total length of time, in which pixels actually emit light in one frame period, can be controlled with video signals so that gray scales are displayed.

In the example of the light-emitting display device illustrated in FIG. 12B, in a case where two TFTs, a switching TFT and a current control TFT, are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

In addition, also in the light-emitting display device, a part of the driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in Embodiment 1 or 2.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules are moved in opposite directions to each other and only the color of the particles concentrated on one side is exhibited. Note that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant moves to a high-electric field region. An electrophoretic display does not need to have a polarizer and a counter substrate, which are required in a liquid crystal display device, and both the thickness and weight of the electrophoretic display device can be a half of those of a liquid crystal display device.

A solution in which the aforementioned microcapsules are dispersed throughout a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained with the thin film transistor described in Embodiment 1 or 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above steps, a highly reliable display device as a semiconductor device can be manufactured.

This embodiment can be combined with any of the other embodiments as appropriate.

Embodiment 4

A thin film transistor of an embodiment of the present invention is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using a thin film transistor of an embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. An embodiment of the present invention relates to one embodiment of an element substrate before the display element is completed in a manufacturing process of the display device, and the element substrate is provided with means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

Figure 20A:
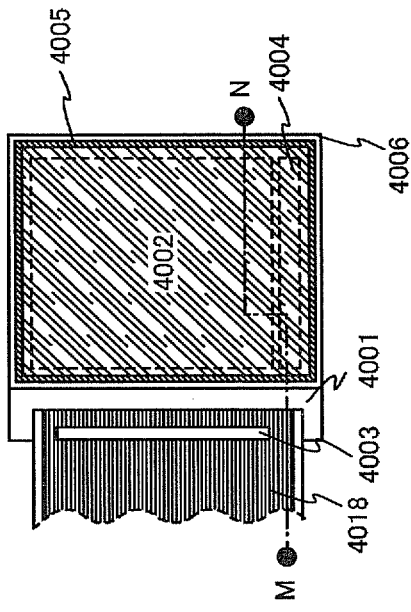
FIGS. 20A to 20C illustrate a semiconductor device.
Figure 20B:
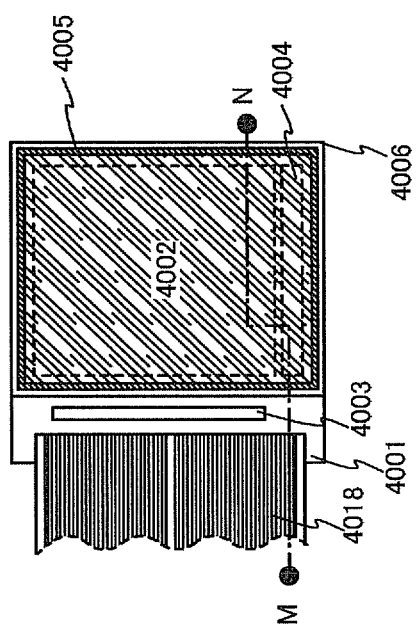
Figure 20C:
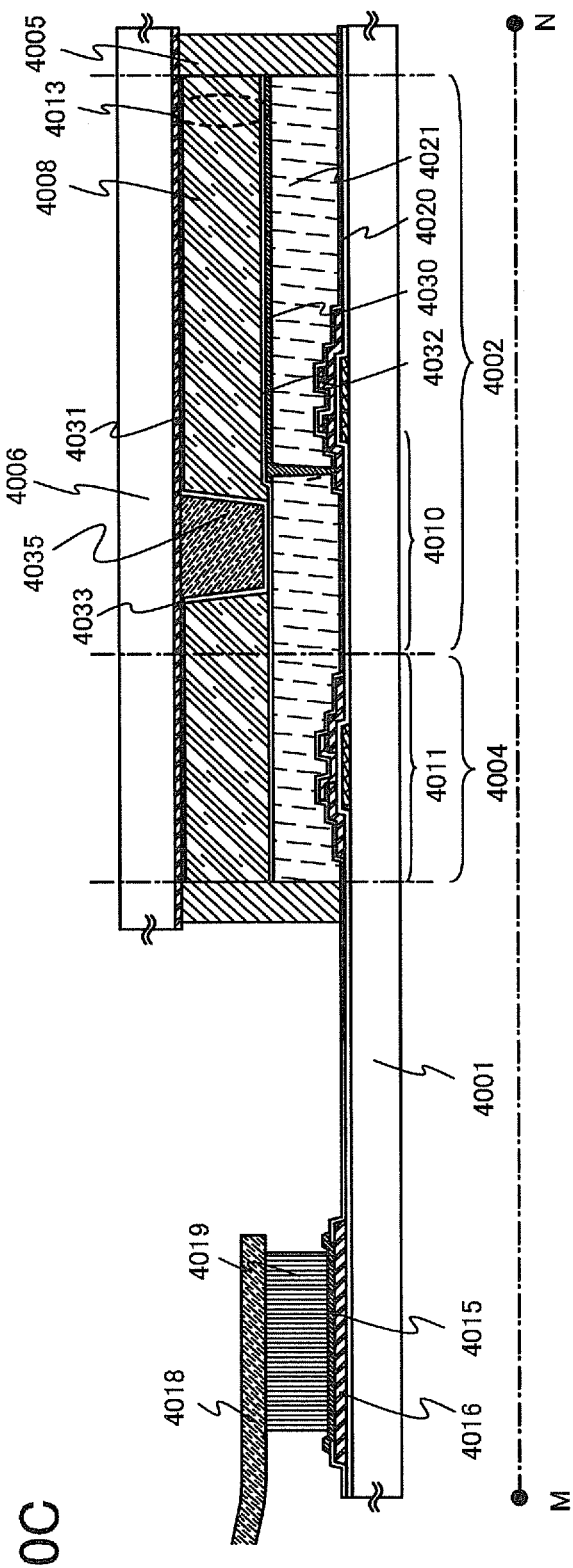

In this embodiment, the appearance and a cross section of a liquid crystal display panel, which is one embodiment of a semiconductor device of the present invention, will be described with reference to FIGS. 20A to 20C. FIGS. 20A and 20B are top views of a panel in which highly reliable thin film transistors 4010 and 4011 each including an oxygen-excess oxide semiconductor layer over a gate insulating layer, a source electrode layer, a drain electrode layer, a source region, and a drain region which have been subjected to oxygen radical treatment, and including oxygen-deficient oxide semiconductor layers as the source region and the drain region, and a liquid crystal element 4013 formed over a first substrate 4001 are sealed between the first substrate 4001 and a second substrate 4006 with a sealant 4005. FIG. 20C is a cross-sectional view taken along a line M-N of FIGS. 20A and 20B.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 20A illustrates an example of mounting the signal line driver circuit 4003 by a COG method, and FIG. 20B illustrates an example of mounting the signal line driver circuit 4003 by a TAB method.

The pixel portion 4002 and the scan line driver circuit 4004 provided over the first substrate 4001 include a plurality of thin film transistors. FIG. 20C illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

Each of the thin film transistors 4010 and 4011 corresponds to a highly reliable thin film transistor including an oxygen-excess oxide semiconductor layer over a gate insulating layer, a source electrode layer, a drain electrode layer, a source region, and a drain region which have been subjected to oxygen radical treatment, and including oxygen-deficient oxide semiconductor layers as the source region and the drain region, and the thin film transistor described in Embodiment 1 or 2 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

Although an example of a transmissive liquid crystal display device is described in this embodiment, an embodiment of the present invention can also be applied to a reflective liquid crystal display device and a transflective liquid crystal display device.

While an example of the liquid crystal display device in which the polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing steps. Further, a light-blocking film serving as a black matrix may be provided.

In this embodiment, in order to reduce surface unevenness of the thin film transistor and to improve reliability of the thin film transistor, the thin film transistor obtained in Embodiment 1 is covered with the insulating layers (the insulating layer 4020 and the insulating layer 4021) functioning as a protective film or a planarizing insulating film. Note that the protective film is provided to prevent entry of contaminant impurities such as an organic substance, a metal, or moisture floating in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method. Although an example in which the protective film is formed by a sputtering method is described in this embodiment, the present invention is not limited to this example, and the protective film may be formed by a variety of methods.

In this embodiment, the insulating layer 4020 having a stacked-layer structure is formed as a protective film. Here, as a first layer of the insulating layer 4020, a silicon oxide film is formed by a sputtering method. The use of a silicon oxide film as a protective film has an effect of preventing hillock of an aluminum film.

As a second layer of the protective film, an insulating layer is formed. In this embodiment, as the second layer of the insulating layer 4020, a silicon nitride film is formed by a sputtering method. The use of the silicon nitride film as the protective film can prevent mobile ions of sodium or the like from entering a semiconductor region so that variation in electrical characteristics of the TFT can be suppressed.

After the protective film is formed, the IGZO semiconductor layer may be subjected to annealing (300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. A siloxane-based resin may include as a substituent at least one of fluorine, an alkyl group, and an aryl group, as well as hydrogen. Note that the insulating layer 4021 may be formed by stacking a plurality of insulating films formed of these materials.

Note that a siloxane-based resin is a resin formed from a siloxane material as a starting material and having the bond of Si—O—Si. The siloxane-based resin may include as a substituent at least one of fluorine, an alkyl group, and aromatic hydrocarbon, as well as hydrogen.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In the case of forming the insulating layer 4021 using a material solution, annealing (300° C. to 400° C.) of the IGZO semiconductor layer may be performed at the same time as a baking step. The baking step of the insulating layer 4021 also serves as annealing of the IGZO semiconductor layer, whereby a semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

A conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called 7c-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 through an anisotropic conductive film 4019.

FIGS. 20A to 20C illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 21:
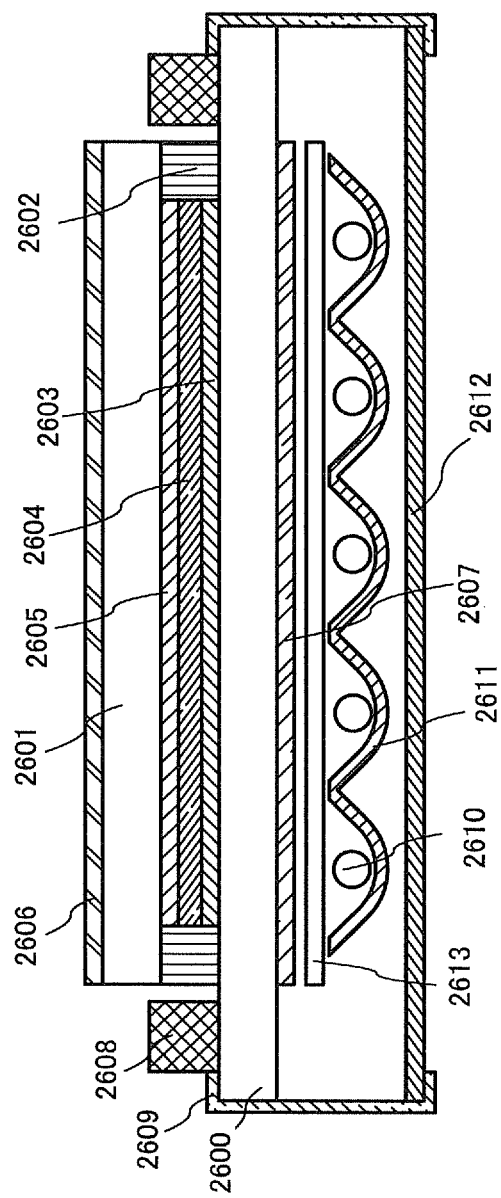
FIG. 21 illustrates a semiconductor device.

FIG. 21 illustrates an example in which a liquid crystal display module is formed as a semiconductor device by using a TFT substrate 2600 manufactured according to the present invention.

FIG. 21 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through this process, a highly reliable liquid crystal display device as a semiconductor device can be manufactured.

This embodiment can be combined with any of the other embodiments as appropriate.

Embodiment 5

In this embodiment, an example of electronic paper will be described as a semiconductor device of an embodiment of the present invention.

Figure 11:
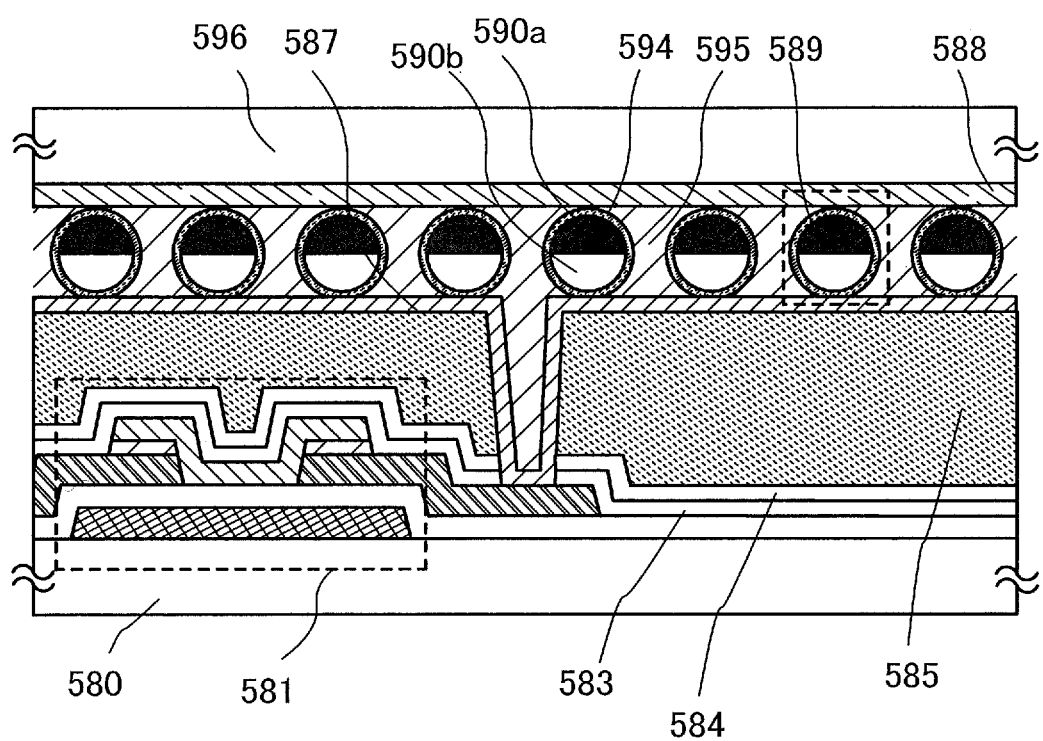
FIG. 11 illustrates a semiconductor device.

FIG. 11 illustrates active matrix electronic paper as an example of a semiconductor device to which the present invention is applied. A thin film transistor 581 used for the semiconductor device can be manufactured in a manner similar to the thin film transistor described in Embodiment 1 and is a highly reliable thin film transistor including an oxygen-excess oxide semiconductor layer over a gate insulating layer, a source electrode layer, a drain electrode layer, a source region, and a drain region which have been subjected to oxygen radical treatment, and including oxygen-deficient oxide semiconductor layers as the source region and the drain region. The thin film transistor described in Embodiment 2 can also be used as the thin film transistor 581 of this embodiment.

The electronic paper in FIG. 11 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor with a bottom gate structure provided between a substrate 580 and a substrate 596, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (see FIG. 11).

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper as a semiconductor device can be manufactured.

This embodiment can be combined with any of the other embodiments as appropriate.

Embodiment 6

In this embodiment, an example of a light-emitting display device will be described as a semiconductor device of an embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 18:
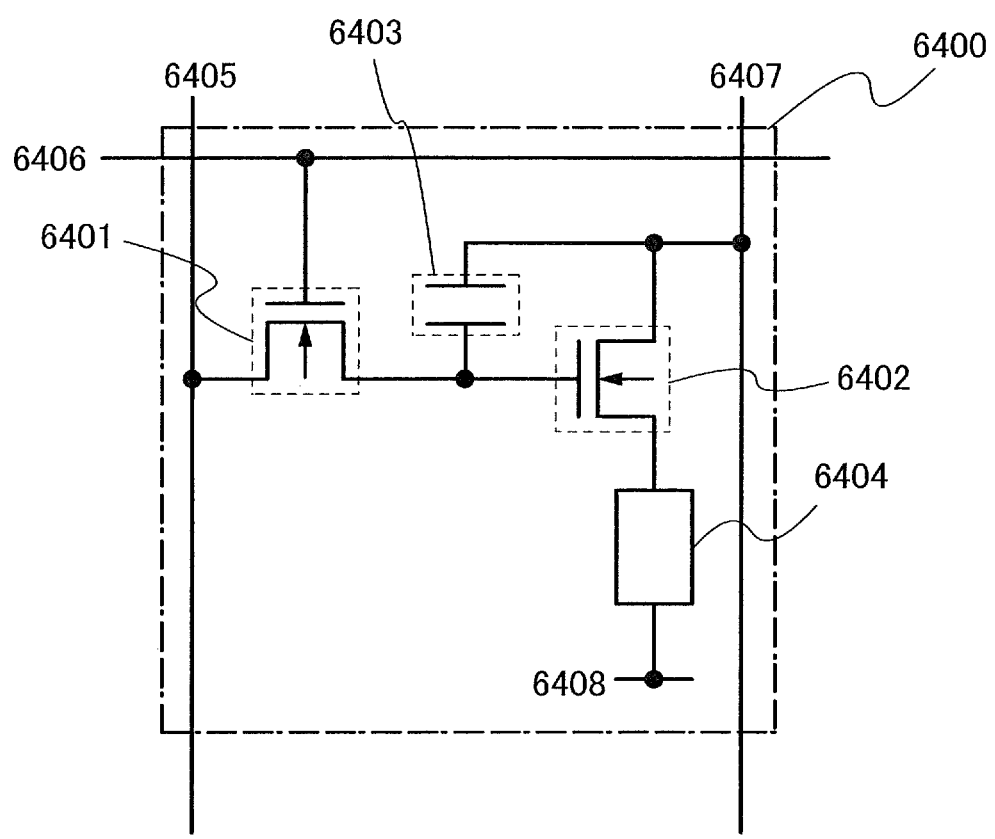
FIG. 18 illustrates a pixel equivalent circuit of a semiconductor device.

FIG. 18 illustrates an example of a pixel structure to which digital time grayscale driving can be applied, as an example of a semiconductor device to which the present invention is applied.

A structure and operation of a pixel to which digital time grayscale driving can be applied are described. In this example, one pixel includes two n-channel transistors each of which includes an oxide semiconductor layer (an IGZO semiconductor layer) as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage higher than or equal to (voltage of the power supply line+ Vth of the driver transistor 6402) is applied to the signal line 6405.

In the case of performing analog grayscale driving instead of digital time grayscale driving, the same pixel structure as that in FIG. 18 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 18 is not limited thereto. For example, a switch, a resistor, a capacitor, a transistor, a logic circuit, or the like may be added to the pixel illustrated in FIG. 18.

Next, structures of the light-emitting element will be described with reference to FIGS. 19A to 19C. A cross-sectional structure of a pixel will be described by taking an n-channel driving TFT as an example. Driving TFTs 7001, 7011, and 7021 used for semiconductor devices illustrated in FIGS. 19A to 19C can be manufactured in a manner similar to the thin film transistor described in Embodiment 1 and are highly reliable thin film transistors each including an oxygen-excess oxide semiconductor layer over a gate insulating layer, a source electrode layer, a drain electrode layer, a source region, and a drain region which have been subjected to oxygen radical treatment, and including oxygen-deficient oxide semiconductor layers as the source region and the drain region. Alternatively, the thin film transistor described in Embodiment 2 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure of an embodiment of the present invention can be applied to a light-emitting element having any of these emission structures.

A light-emitting element having a top emission structure will be described with reference to FIG. 19A.

Figure 19A:
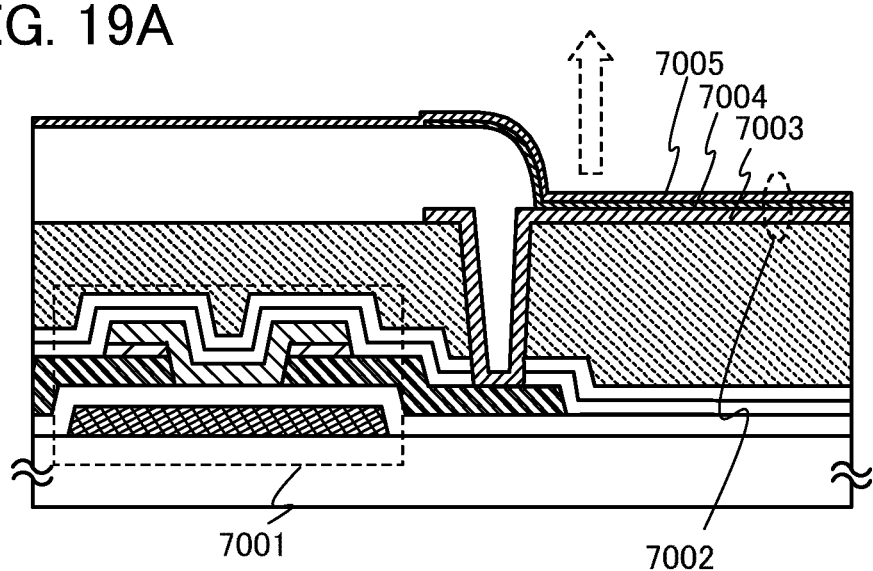
FIGS. 19A to 19C each illustrate a semiconductor device.

FIG. 19A is a cross-sectional view of a pixel in the case where the driving TFT 7001 is an n-channel TFT and light is emitted from a light-emitting element 7002 to an anode 7005 side. In FIG. 19A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 19A, light is emitted from the light-emitting element 7002 to the anode 7005 side as indicated by an arrow.

Next, a light-emitting element having a bottom emission structure will be described with reference to FIG. 19B. FIG. 19B is a cross-sectional view of a pixel in the case where the driving TFT 7011 is an n-channel transistor and light is emitted from a light-emitting element 7012 to a cathode 7013 side. In FIG. 19B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 19A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 19A, the light-emitting layer 7014 may be formed using either a single layer or a plurality of layers stacked. The anode 7015 is not required to transmit light, but can be formed using a light-transmitting conductive material as in the case of FIG. 19A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 19B, light is emitted from the light-emitting element 7012 to the cathode 7013 side as indicated by an arrow.

Next, a light-emitting element having a dual emission structure will be described with reference to FIG. 19C. In FIG. 19C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 19A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 19A, the light-emitting layer 7024 may be formed using either a single layer or a plurality of layers stacked. The anode 7025 can be formed using a light-transmitting conductive material as in the case of FIG. 19A.

The light-emitting element 7022 corresponds to a region where the cathode 7023, the light-emitting layer 7024, and the anode 7025 overlap with one another. In the case of the pixel illustrated in FIG. 19C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 19B:
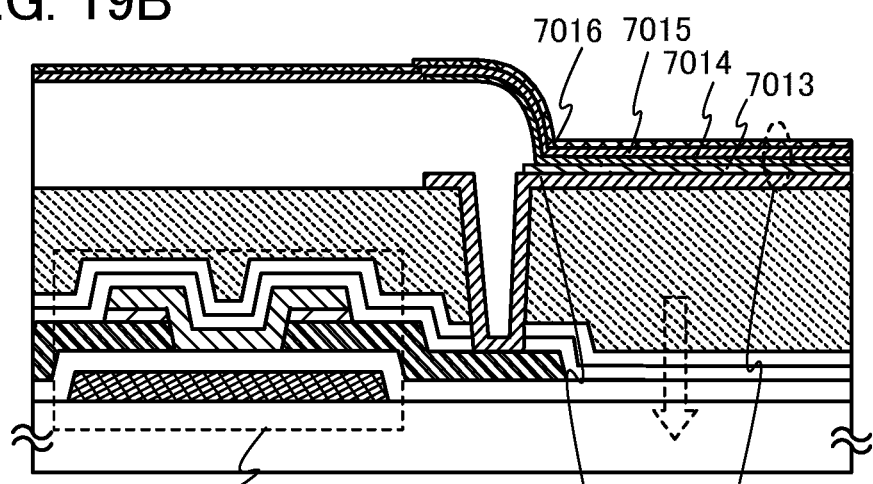
Figure 19C:
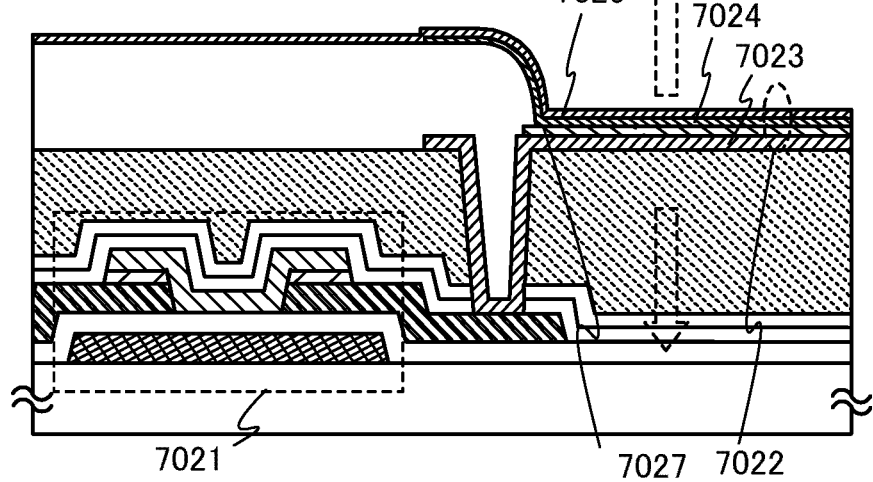

A semiconductor device described in this embodiment is not limited to the structures illustrated in FIGS. 19A to 19C and can be modified in various ways based on the spirit of techniques according to the present invention.

Figure 22A:
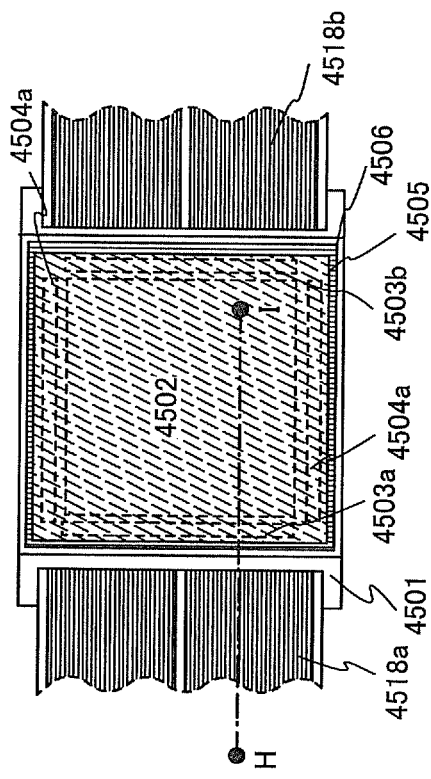
FIGS. 22A and 22B illustrate a semiconductor device.
Figure 22B:
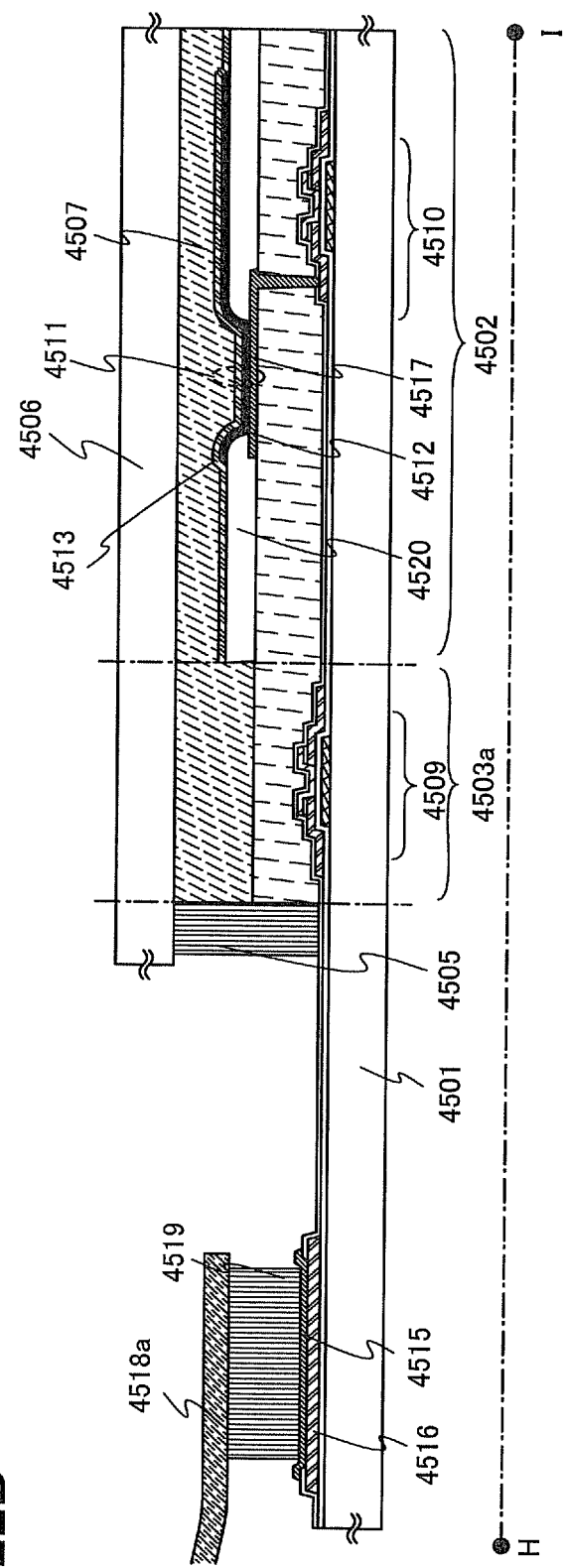

Next, the appearance and a cross section of a light-emitting display panel (also referred to as a light-emitting panel), which is one embodiment of a semiconductor device of the present invention, will be described with reference to FIGS. 22A and 22B. FIG. 22A is a top view of a panel in which a highly reliable thin film transistor including an oxygen-excess oxide semiconductor layer over a gate insulating layer, a source electrode layer, a drain electrode layer, a source region, and a drain region which have been subjected to oxygen radical treatment, and including oxygen-deficient oxide semiconductor layers as the source region and the drain region and a light-emitting element formed over a first substrate are sealed between the first substrate and a second substrate with a sealant. FIG. 22B is a cross-sectional view taken along a line H-I of FIG. 22A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air as described above.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 22B.

Each of the thin film transistors 4509 and 4510 corresponds to a highly reliable thin film transistor including an oxygen-excess oxide semiconductor layer over a gate insulating layer, a source electrode layer, a drain electrode layer, a source region, and a drain region which have been subjected to oxygen radical treatment, and including oxygen-deficient oxide semiconductor layers as the source region and the drain region, and the thin film transistor described in Embodiments 1 or 2 can be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, the electroluminescent layer 4512, and the second electrode layer 4513, but the present invention is not limited to that described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be provided as driver circuits formed using a single crystal semiconductor film or polycrystalline semiconductor film over a substrate separately prepared. In addition, only the signal line driver circuits or part thereof, or the scan line driver circuits or part thereof may be separately formed and mounted. This embodiment is not limited to the structure illustrated in FIGS. 22A and 22B.

Through this process, a highly reliable light-emitting display device (display panel) as a semiconductor device can be manufactured.

This embodiment can be combined with any of the other embodiments as appropriate.

Embodiment 7

A semiconductor device of an embodiment of the present invention can be applied to electronic paper. Electronic paper can be used for electronic devices of a variety of fields as long as they can display data. For example, electronic paper can be applied to an electronic book (e-book) reader, a poster, an advertisement in a vehicle such as a train, displays of various cards such as a credit card, and the like. Examples of the electronic devices are illustrated in FIGS. 23A and 23B and FIG. 24.

Figure 23A:
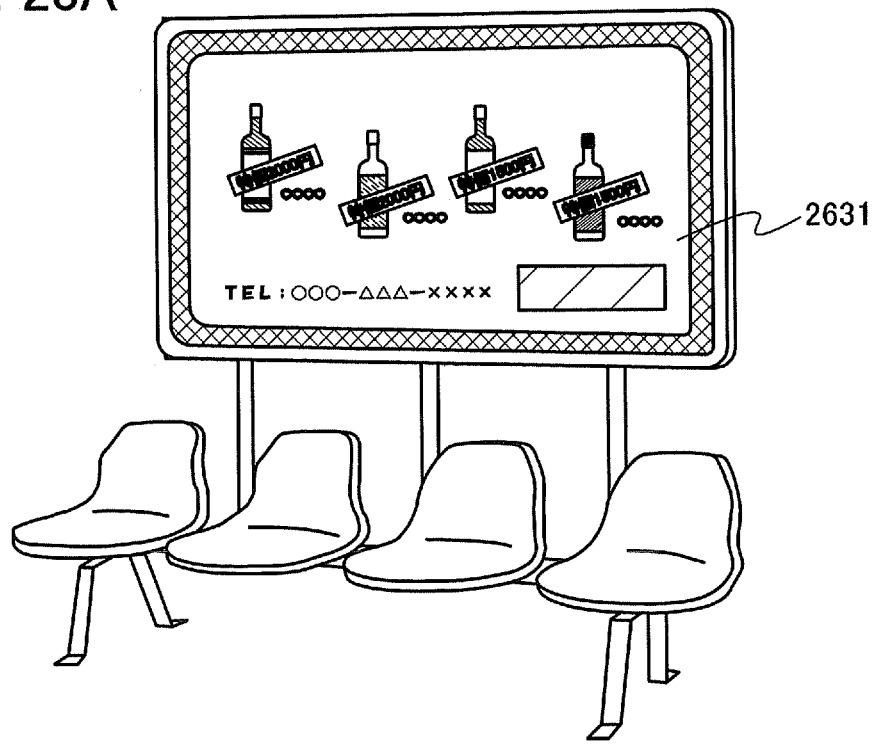
FIGS. 23A and 23B each illustrate an example of a usage pattern of electronic paper.

FIG. 23A illustrates a poster 2631 formed using electronic paper. In the case where an advertising medium is printed paper, the advertisement is replaced by manpower; however, by using electronic paper to which the present invention is applied, the advertising display can be changed in a short time. Further, an image can be stably displayed without being distorted. Note that the poster may be configured to transmit and receive data wirelessly.

Figure 23B:
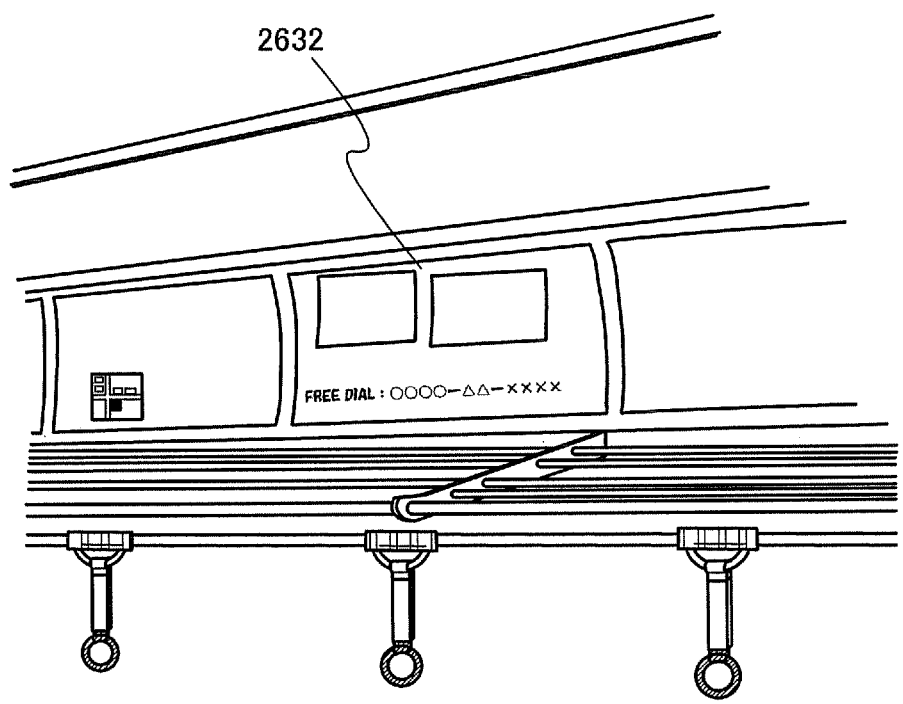

FIG. 23B illustrates an advertisement 2632 in a vehicle such as a train. In the case where an advertising medium is printed paper, the advertisement is replaced by manpower; however, by using electronic paper to which the present invention is applied, the advertising display can be changed in a short time without a lot of manpower. Further, an image can be stably displayed without being distorted. Note that the advertisement in a vehicle may be configured to transmit and receive data wirelessly.

Figure 24:
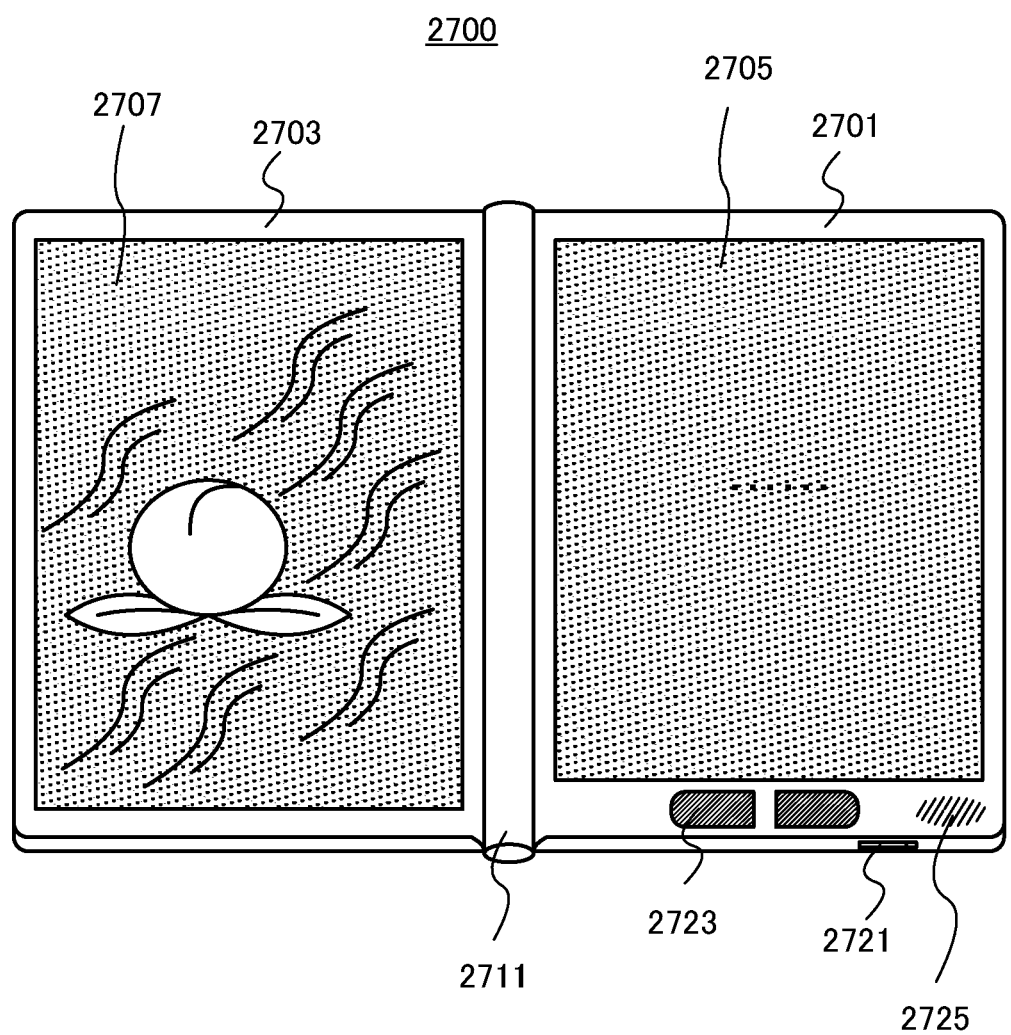
FIG. 24 is an external view of an example of an electronic book reader.

FIG. 24 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In the case where the display portion 2705 and the display portion 2707 display different images, for example, a display portion on the right side (the display portion 2705 in FIG. 24) can display text and a display portion on the left side (the display portion 2707 in FIG. 24) can display graphics.

FIG. 24 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insert portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.

Embodiment 8

A semiconductor device according to the present invention can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 25A:
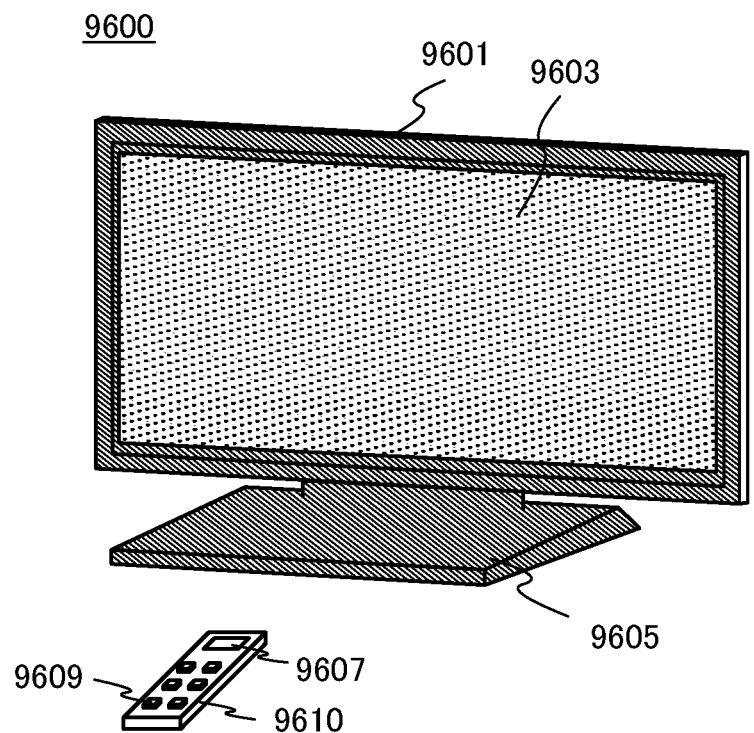
FIG. 25A is an external view of an example of a television device and FIG. 25B is an external view of an example of a digital photo frame.

FIG. 25A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 25B:
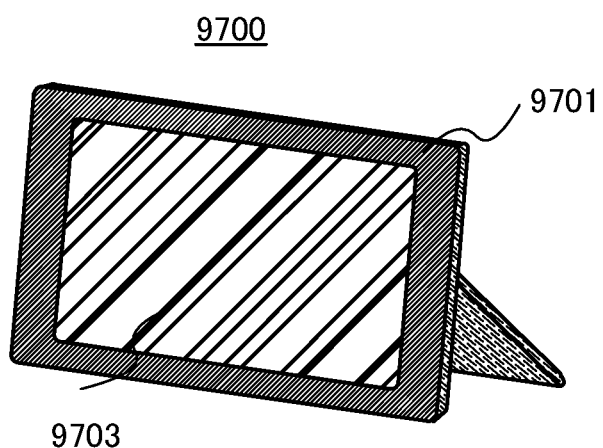

FIG. 25B illustrates an example of a digital photo frame 9700. For example, in the digital photo frame 9700, a display portion 9703 is incorporated in a housing 9701. The display portion 9703 can display various images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 26A:
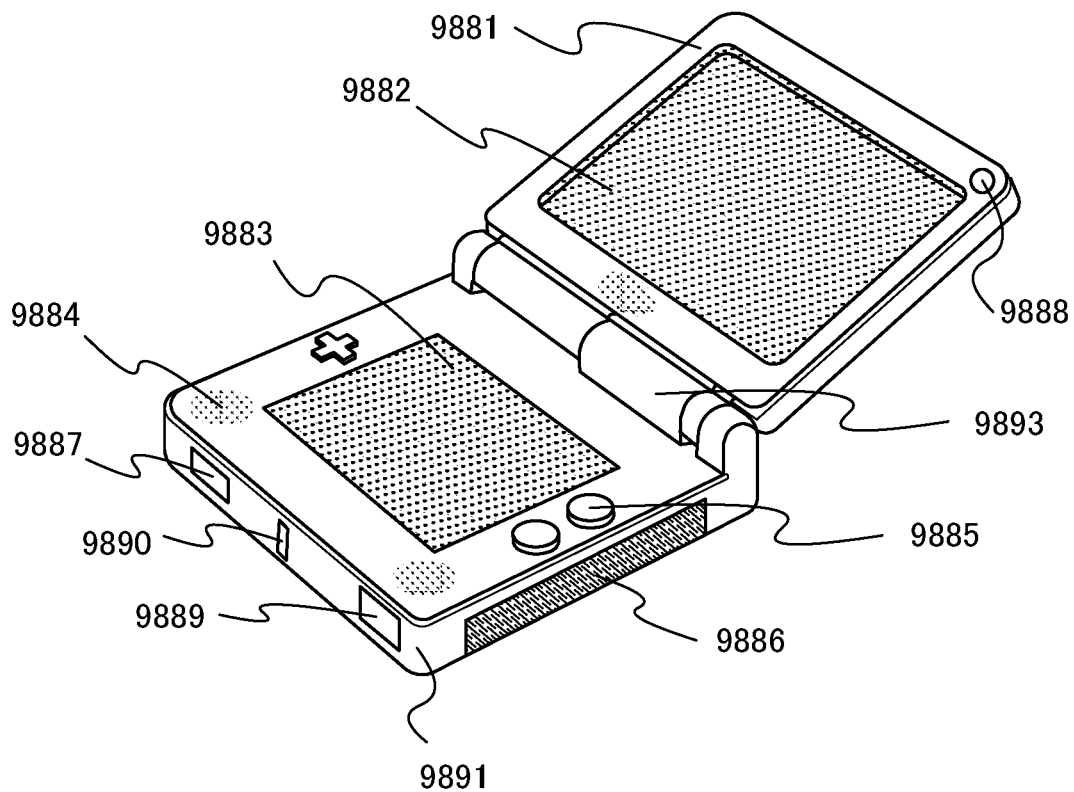
FIGS. 26A and 26B are external views of examples of an amusement machine.

FIG. 26A is a portable game machine and includes two housings, a housing 9881 and a housing 9891, which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 26A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to that described above. The portable game machine may have a structure in which additional accessory equipment is provided as appropriate as long as at least a semiconductor device according to the present invention is provided. The portable game machine illustrated in FIG. 26A has a function of reading a program or data stored in a recording medium to display it on the display portion, and a function of sharing information with another portable game machine by wireless communication. Note that a function of the portable game machine illustrated in FIG. 26A is not limited to those described above, and the portable game machine can have a variety of functions.

Figure 26B:
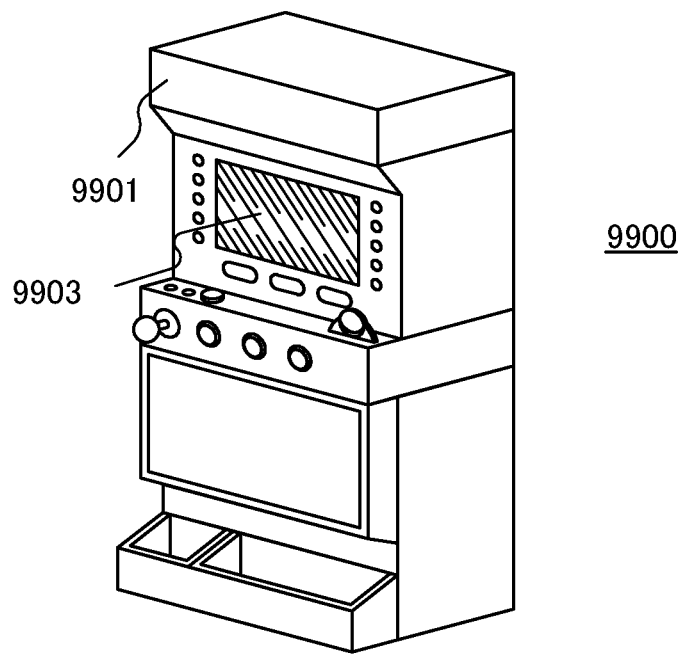

FIG. 26B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, or the like. Needless to say, the structure of the slot machine 9900 is not limited to the above-described structure. The slot machine may have a structure in which additional accessory equipment is provided as appropriate as long as at least a semiconductor device according to the present invention is provided.

Figure 27:
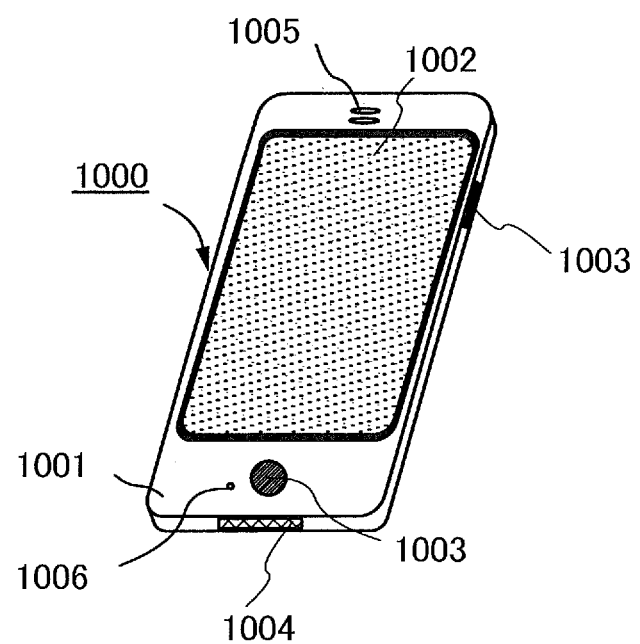
FIG. 27 is an external view of an example of a mobile phone handset.

FIG. 27 illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 27 is touched with a finger or the like, data can be input into the mobile phone handset 1000. Further, operations such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1002 so that characters displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically for a landscape mode or a portrait mode).

The screen modes are changed by touching the display portion 1002 or using the operation buttons 1003 of the housing 1001. Alternatively, the screen modes may be changed depending on the kind of the image displayed on the display portion 1002. For example, when a signal of an image displayed on the display portion is the one of moving image data, the screen mode is changed to the display mode. When the signal is the one of text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

This application is based on Japanese Patent Application serial no. 2008-234603 filed with Japan Patent Office on Sep. 12, 2008, the entire contents of which are hereby incorporated by reference.

The invention claimed is:
1. A display device comprising:
a substrate;
a pixel portion over the substrate;
a driver circuit electrically connected to the pixel portion;
a terminal portion over the substrate; and
a flexible printed circuit electrically connected to the terminal portion,
wherein the pixel portion comprises a first transistor, the first transistor comprising:
a semiconductor layer comprising a channel formation region;
a first insulating film;

a first conductive layer overlapping with the channel formation region with the first insulating film therebetween; and
a second conductive layer electrically connected to the semiconductor layer,
wherein the driver circuit comprises a second transistor,
wherein the first transistor and the second transistor are formed in a same layer,
wherein the terminal portion comprises:
a third conductive layer made from a same material as the first conductive layer; and
a fourth conductive layer made from a same material as the second conductive layer,
wherein the fourth conductive layer is electrically connected to the second transistor,
wherein the fourth conductive layer overlaps with the third conductive layer with the first insulating film therebetween,
wherein the first insulating film comprises a region in direct contact with a side surface of the first conductive layer,
wherein the fourth conductive layer is in direct contact with the first insulating film
wherein the fourth conductive layer is electrically connected to the flexible printed circuit, and
wherein the third conductive layer does not electrically connect to the driver circuit and the pixel portion.

2. The display device according to claim 1, wherein each of the first conductive layer and the third conductive layer is in contact with the substrate.

3. The display device according to claim 1, wherein the semiconductor layer comprises indium, gallium, and zinc.

4. The display device according to claim 1, wherein the second conductive layer is electrically connected to the semiconductor layer through a semiconductor region, wherein the semiconductor region comprises a same material as the semiconductor layer, and wherein a resistance of the semiconductor region is lower than a resistance of the semiconductor layer.

5. The display device according to claim 1,
wherein the first transistor further comprises:
a second insulating film over the second conductive layer; and
a fifth conductive layer over the second insulating film,
wherein the fifth conductive layer is electrically connected to the second conductive layer.

6. The display device according to claim 5,
wherein the terminal portion further comprises:
a sixth conductive layer made from a same material as the fifth conductive layer,
wherein the sixth conductive layer overlaps with the fourth conductive layer with the second insulating film therebetween, and
wherein the sixth conductive layer is electrically connected to the fourth conductive layer through a first opening of the second insulating film.

7. The display device according to claim 6, wherein the sixth conductive layer comprises a transparent conductive layer.

8. The display device according to claim 6, wherein the fourth conductive layer is electrically connected to the flexible printed circuit through the sixth conductive layer.

9. A display device comprising:
a substrate;
a pixel portion over the substrate;
a driver circuit electrically connected to the pixel portion;
a terminal portion over the substrate; and
a flexible printed circuit electrically connected to the terminal portion,
wherein the pixel portion comprises a first transistor, the first transistor comprising:
a semiconductor layer comprising a channel formation region;
a first insulating film;
a first conductive layer overlapping with the channel formation region with the first insulating film therebetween; and
a second conductive layer electrically connected to the semiconductor layer,
wherein the driver circuit comprises a second transistor,
wherein the first transistor and the second transistor are formed in a same layer,
wherein the terminal portion comprises:
a third conductive layer made from a same material as the first conductive layer; and
a fourth conductive layer made from a same material as the second conductive layer,
wherein the fourth conductive layer is electrically connected to the second transistor,
wherein the fourth conductive layer overlaps with the third conductive layer with the first insulating film therebetween,
wherein the fourth conductive layer is electrically connected to the flexible printed circuit,
wherein the fourth conductive layer is in direct contact with the first insulating film, and
wherein the third conductive layer does not electrically connect to the driver circuit and the pixel portion.

10. The display device according to claim 9, wherein each of the first conductive layer and the third conductive layer is in contact with the substrate.

11. The display device according to claim 9, wherein the semiconductor layer comprises indium, gallium, and zinc.

12. The display device according to claim 9,
wherein the second conductive layer is electrically connected to the semiconductor layer through a semiconductor region,
wherein the semiconductor region comprises a same material as the semiconductor layer, and
wherein a resistance of the semiconductor region is lower than a resistance of the semiconductor layer.

13. The display device according to claim 9,
wherein the first transistor further comprises:
a second insulating film over the second conductive layer; and
a fifth conductive layer over the second insulating film,
wherein the fifth conductive layer is electrically connected to the second conductive layer.

14. The display device according to claim 13,
wherein the terminal portion further comprises:
a sixth conductive layer made from a same material as the fifth conductive layer,
wherein the sixth conductive layer overlaps with the fourth conductive layer with the second insulating film therebetween, and
wherein the sixth conductive layer is electrically connected to the fourth conductive layer through a first opening of the second insulating film.

15. The display device according to claim 14, wherein the sixth conductive layer comprises a transparent conductive layer.

16. The display device according to claim 14, wherein the fourth conductive layer is electrically connected to the flexible printed circuit through the sixth conductive layer.

17. A display device comprising:
a substrate;
a pixel portion over the substrate;
a driver circuit electrically connected to the pixel portion;
a terminal portion over the substrate; and
a flexible printed circuit electrically connected to the terminal portion,
wherein the pixel portion comprises a first transistor, the first transistor comprising:
- a semiconductor layer comprising a channel formation region;
- a first insulating film;
- a first conductive layer overlapping with the channel formation region with the first insulating film therebetween;
- a second conductive layer electrically connected to the semiconductor layer;
- a second insulating film over the second conductive layer; and
- a third conductive layer over the second insulating film, the third conductive layer electrically connected to the second conductive layer, wherein the driver circuit comprises a second transistor,
wherein the first transistor and the second transistor are formed in a same layer,
wherein the terminal portion comprises:
- a fourth conductive layer made from a same material as the first conductive layer;
- a fifth conductive layer made from a same material as the second conductive layer; and
- a sixth conductive layer made from a same material as the third conductive layer, wherein the fifth conductive layer is electrically connected to the second transistor,
wherein the fifth conductive layer is in direct contact with the first insulating film,
wherein the sixth conductive layer is electrically connected to the fifth conductive layer through a first opening of the second insulating film,
wherein the sixth conductive layer is electrically connected to the fourth conductive layer through a second opening of the second insulating film and a third opening of the first insulating film, and
wherein the sixth conductive layer is electrically connected to the flexible printed circuit.

18. The display device according to claim 17, wherein each of the first conductive layer and the fourth conductive layer is in contact with the substrate.

19. The display device according to claim 17, wherein the sixth conductive layer comprises a transparent conductive layer.

20. The display device according to claim 17, wherein the semiconductor layer comprises indium, gallium, and zinc.

* * * * *